(12) United States Patent
Tumati et al.

(10) Patent No.: US 9,778,303 B2
(45) Date of Patent: Oct. 3, 2017

(54) METHOD AND SYSTEM FOR CONTINUOUS OFF CHIP CAPACITOR DETECTION FOR LINEAR REGULATORS

(71) Applicant: Analog Devices Global, Hamilton (BM)

(72) Inventors: Sanjay Tumati, Bangalore (IN); Ankur Ghosh, Bangalore (IN)

(73) Assignee: Analog Devices Global, Hamilton (BM)

( * ) Notice: Subject to any disclaimer, the term of this patent is extended or adjusted under 35 U.S.C. 154(b) by 84 days.

(21) Appl. No.: 14/881,684

(22) Filed: Oct. 13, 2015

(65) Prior Publication Data

US 2017/0102418 A1 Apr. 13, 2017

(51) Int. Cl.
*G01R 27/26* (2006.01)
*G05F 1/56* (2006.01)

(52) U.S. Cl.
CPC ........ *G01R 27/2605* (2013.01); *G05F 1/56* (2013.01)

(58) Field of Classification Search
USPC .................. 324/658, 676, 678, 681, 684
See application file for complete search history.

(56) References Cited

U.S. PATENT DOCUMENTS

| 3,657,602 | A | 4/1972 | Boehm et al. |
| 3,859,564 | A | 1/1975 | Zulaski |
| 8,128,549 | B2 | 3/2012 | Testani et al. |
| 8,378,648 | B2 | 2/2013 | Unetich et al. |
| 2003/0218450 | A1* | 11/2003 | Bonte ................ G05F 1/575 323/273 |
| 2013/0328569 | A1 | 12/2013 | Gajic et al. |

OTHER PUBLICATIONS

Williams, Jim, Load Transient Response Testing for Voltage Regulators, Practical Considerations for Testing and Evaluating Results, Linear Technology, Oct. 2006, 16 pages.
Texas Instruments, AN-1148 Linear Regulators: Theory of Operation and Compensation, Texas Instruments Incorporated, May 2013, 15 pages.
Mishra et al., Understand Linear Regulator Stability, EDN, Nov. 26, 2012, 4 pages.

* cited by examiner

*Primary Examiner* — Vincent Q Nguyen
(74) *Attorney, Agent, or Firm* — Wolf, Greenfield & Sacks, P.C.

(57) ABSTRACT

Various embodiments efficiently detect the presence of an external capacitor electrically coupled to the output of a voltage regulator by perturbing the voltage output of the voltage regulator while the regulator is in operation and supplying, or ready to supply, regulated voltage to a load, and detecting the reaction of the regulator's output.

20 Claims, 13 Drawing Sheets

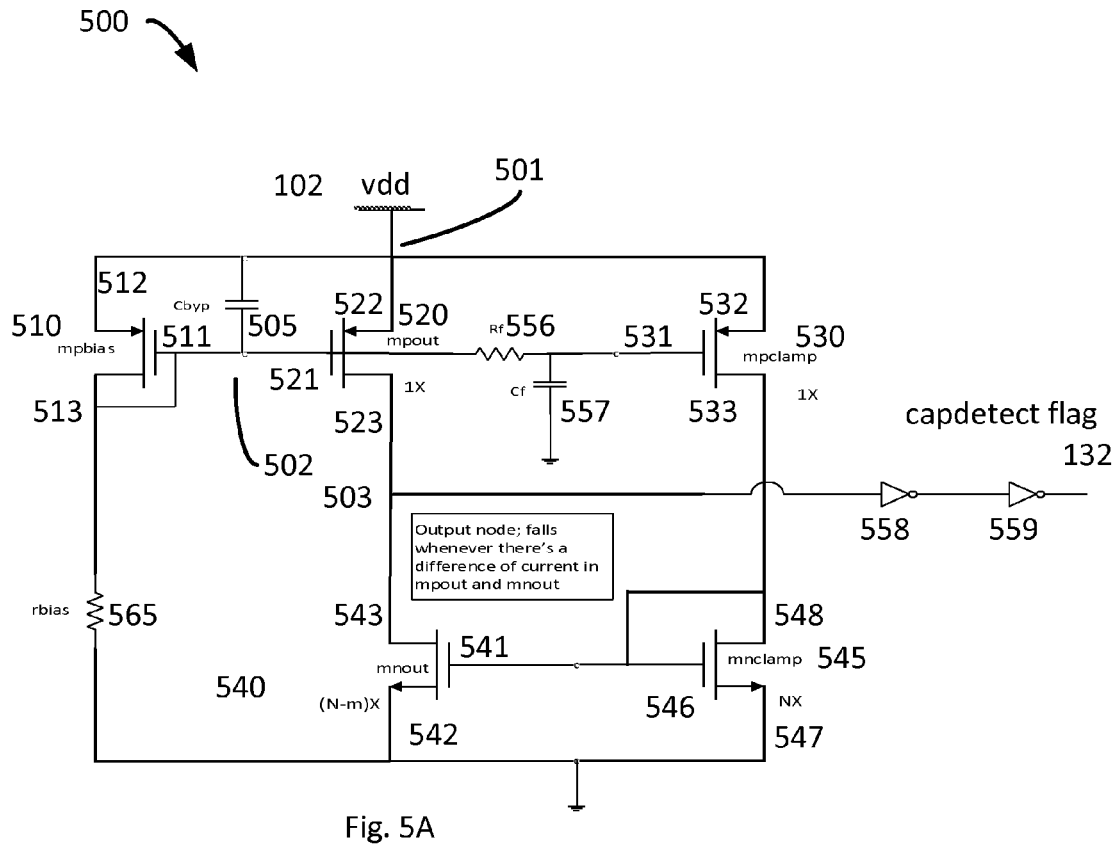
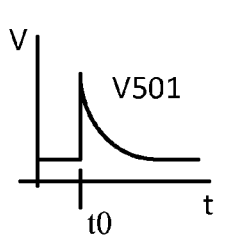
Fig. 5B
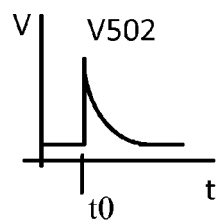
Fig. 5C
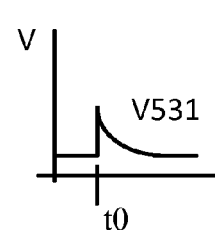
Fig. 5D
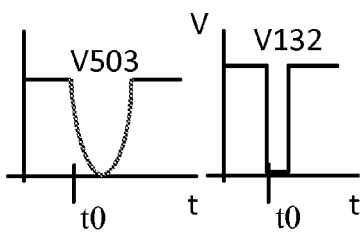
Fig. 5E    Fig. 5F
Fig. 5A

METHOD AND SYSTEM FOR CONTINUOUS OFF CHIP CAPACITOR DETECTION FOR LINEAR REGULATORS

TECHNICAL FIELD

The present invention relates to voltage regulators, and more particularly to stability of voltage regulators.

BACKGROUND ART

Many linear voltage regulators include a feedback network to maintain a fixed D.C. voltage output at an output terminal. Many linear voltage regulators employ a capacitor coupled to the voltage output to contribute to the stability of the regulator and to reduce the supply noise at high frequencies. The capacitance of the capacitor is typically part of the regulator's design specification, and is not part of the load driven by the regulator. In the case of an integrated circuit regulator, the capacitor may be external to the integrated circuit, and may even be external to the integrated circuit's package. If so, the capacitor is coupled to the integrated circuit by a bond wire or other conductive lead. If the electrical connection between the capacitor and regulator fails, the regulator may continue to operate for some time, but may become unstable, or may incur high supply noise on the regulator's output.

SUMMARY OF THE EMBODIMENTS

In accordance with one embodiment, a method of detecting the absence of a desired capacitance on the output of a linear voltage regulator, includes the steps of providing a linear voltage regulator circuit having a voltage output node and coupling the output node to a load circuit, and then establishing the linear voltage regulator circuit in a steady state of operation such that the linear voltage regulator circuit supplies a regulated DC voltage to the load via the voltage output node.

The method then includes perturbing the regulated DC voltage, for example by injecting or extracting a discrete charge packet at the voltage output node, thereby causing a voltage change (e.g., a voltage transient) at the voltage output node. Embodiments that inject a charge packet at the voltage output node may include providing a discrete electrical pulse at a control input (e.g., a voltage signal) of a transistor coupled between a voltage source (e.g., a power supply) and the output node, the transistor conveying the discrete charge packet onto the output node. Embodiments that extract a discrete charge packet at the voltage output node may include providing a discrete electrical pulse at a control input of a transistor coupled between a ground reference and the output node, the transistor conveying the discrete charge packet off of the voltage output node.

The voltage transient has a magnitude that is a function of total capacitance loading the output node. The next steps include assessing the magnitude of the voltage transient at the voltage output node; and producing an alert if the magnitude of the voltage transient at the voltage output node exceeds a predetermined threshold.

In some embodiments, the step of assessing the magnitude of the voltage transient at the voltage output node comprises comparing the voltage transient to a predetermined threshold voltage.

There are a variety of ways to implement the step of perturbing the regulated DC voltage. For example, in some embodiments, the step of perturbing the regulated DC voltage includes perturbing the regulated DC voltage periodically at a period that is outside of a load circuit's signal bandwidth. For another example, in some embodiments, the linear voltage regulator has a bandwidth, and the step of perturbing the regulated DC voltage includes perturbing the regulated DC voltage periodically at a period that is outside of the linear voltage regulator's bandwidth. In other embodiments, in which the linear voltage regulator has a bandwidth, perturbing the regulated DC voltage comprises perturbing the regulated DC voltage quasi-periodically or aperiodically outside the linear voltage regulator's bandwidth.

In some embodiments in which the linear voltage regulator has a bandwidth, the step of perturbing the regulated DC voltage includes perturbing the regulated D.C. voltage with a periodic current signal having a frequency outside of the regulator's bandwidth, and band-pass filtering the regulator output node with a band-pass filter configured to pass the frequency of the periodic current signal and to block the regulated DC voltage, and to thereby produce a filtered signal. The step of assessing the magnitude of the voltage transient at the voltage output node then includes assessing the amplitude of the filtered signal.

In another embodiment, a system for detecting the absence of a desired capacitance includes a linear voltage regulator configured to produce a D.C. output voltage at a voltage output node and a controllable current source operably coupled to the voltage output node, the controllable current source configured to perturb the voltage output of the linear voltage regulator with a discrete charge packet, thereby causing a voltage transient at the voltage output node, the voltage transient having a magnitude as a function of total capacitance loading the output node. The system also includes a perturbation detector circuit operably coupled to the voltage output node, the perturbation detector configured to assess the magnitude of the voltage transient at the voltage output node, and to produce an alert signal if the magnitude of the voltage transient at the voltage output node exceeds a predetermined threshold.

Some embodiments also include an output node configured to provide the alert signal to another circuit. The other circuit may be the load circuit, for example.

In some embodiments, the controllable current source includes a control input configured to cause the controllable current source to produce a discrete charge packet in response to a control signal; and a pulse generator configured to produce a control signal to the control input of the controllable current source.

In some embodiments, the control signal comprises a continuous series of control pulses, such that the controllable current source conveys a corresponding series of discrete charge packets. In various embodiments, the series of discrete charge packets may be periodic, or quasi-periodic, or not be periodic.

In some embodiments, the linear voltage regulator has a feedback path and bandwidth. In some such embodiments, the pulse generator produces a pulse having a bandwidth that is outside the bandwidth of the linear voltage regulator such that the feedback path does not respond to any single discrete charge packet, or the series of discrete charge packets.

Various embodiments may employ, as a spike detector circuit a transconductance, dynamically unbalanced spike detector that converts regulator (or spike) voltage to currents (e.g., a transconductance operation) and the currents become unbalanced within the circuit in response to a voltage spike (e.g., the currents are dynamically unbalanced).

BRIEF DESCRIPTION OF THE DRAWINGS

The foregoing features of embodiments will be more readily understood by reference to the following detailed description, taken with reference to the accompanying drawings, in which:

FIGS. 5A-5F schematically illustrate an alternate embodiments of a spike detector;

FIGS. 5G-5L schematically illustrate an alternate embodiment of a spike detector;

DETAILED DESCRIPTION OF SPECIFIC EMBODIMENTS

Figure 1:
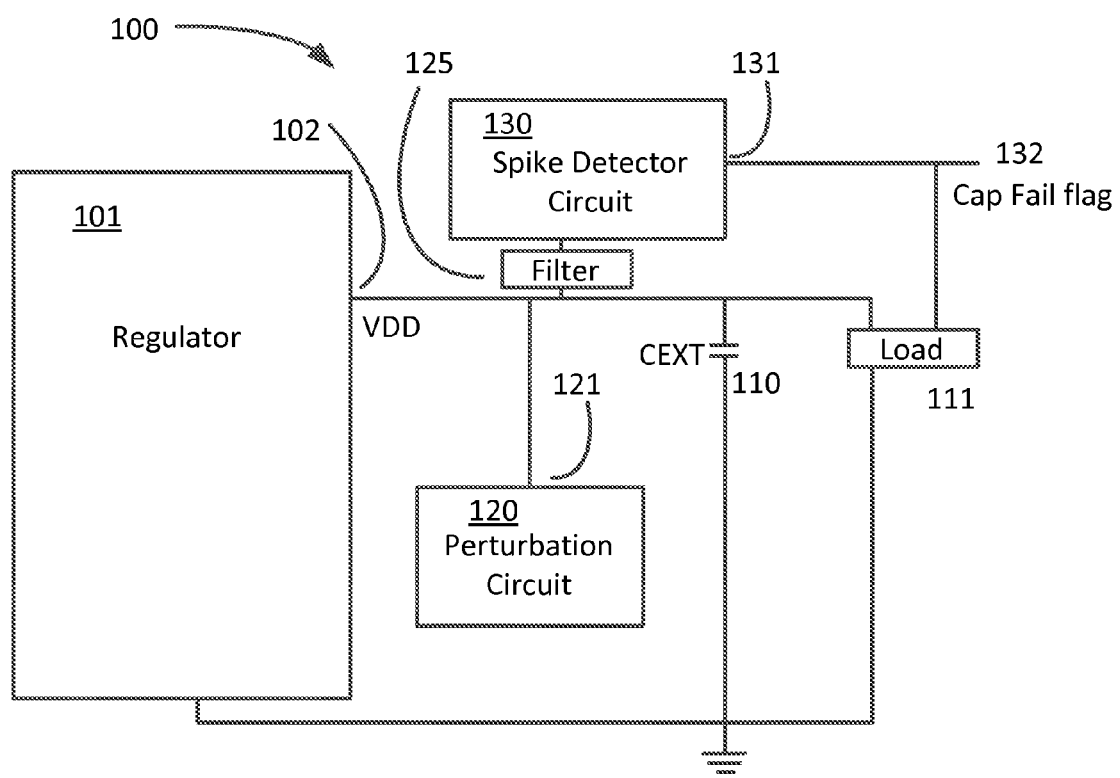
FIG. 1 schematically illustrates a system for detecting the presence of an off-chip capacitor.

Various embodiments provide an efficient way to detect capacitor failure in a linear regulator. The output terminal of many voltage regulators is coupled to an external capacitor, which may contribute to the stability of the regulator, and/or may serve to decouple noise on the regulator's output voltage.

It is known, however, that the external capacitor may become disconnected, potentially causing the regulator to malfunction. For example, the breaking of a conductive lead between a capacitor and an integrated circuit regulator will disconnect the capacitor from the regulator. Such failures, which may occur during handling or operation of a regulator circuit for example, are difficult to detect, particularly if the conductive connection between the capacitor and regulator cannot be easily inspected, such as when a lead is enclosed within the package of a semiconductor regulator, or when a conductive trace on a printed circuit board is internal to the printed circuit board.

It may seem that such a failure would immediately manifest itself in a malfunction of the regulator or the load to which the regulator supplied its regulated voltage output, but that is not always the case. In some applications, a regulator may continue to operate sufficiently well for some period of time, without showing any signs of malfunction, and without causing damage to its load or causing the load to malfunction. For example, the stability of a linear voltage regulator may depend on the current being drawn by its load at any given moment, and if that current changes little, or changes slowly over time, the regulator may be able to provide sufficiently regulated power, at least until a more dynamic load demand occurs.

Further, if the electrical connection between the regulator's voltage output and the capacitor fails only intermittently, the problem may not be identifiable even by direct inspection. For example, the electrical connection between the regulator's voltage output and the capacitor may fail only after the regulator has reached steady-state operation, and/or has warmed up to its normal operating temperature.

Consequently, depending direct observation, or on startup testing, or on circuit failure, to indicate a missing capacitor may not be sufficient in some circumstances. Various embodiments described below provide a more reliable way to detect a missing capacitor.

Definitions. As used in this description and the accompanying claims, the following terms shall have the meanings indicated, unless the context otherwise requires.

The term "steady state" used in connection with a regulator means that the regulator has completed any start-up checks and is ready to supply, or is supplying, regulated voltage to a load.

The term "signal bandwidth" used in connection with a circuit to which a regulator supplies voltage means the frequency range of signals that can be processed by the circuit. When used in connection with a circuit that is processing a signal, the term "signal bandwidth" may refer to the bandwidth of the signal being processed.

A "discrete charge packet" is a limited quantity of electrical charge, for example a limited amount of charge delivered over a predefined amount of time.

A "charge packet source" is a controllable source of discrete charge packets.

A "current source" is an electrical circuit that produces a controllable current output that is independent of the source's voltage output.

FIG. 1 schematically illustrates a first embodiment of a regulator system 100 capable of detecting the presence (or absence) of an external capacitor 110. The system includes a linear regulator, 101. As is known in the art, a voltage regulator produces a regulated voltage output at an output node 102, which output voltage is ideally independent of the load 111 that is powered by the regulator 101. To that end, some linear voltage regulators include a control loop (e.g., a feedback circuit), that compares the regulator's output voltage to a fixed reference voltage. The control loop controls the regulator's circuitry in such a way as to counteract any difference between them, thereby regulating the regulator's output voltage. The regulator 101 may be such a regulator.

The ability of a voltage regulator (e.g., 101) to regulate its output voltage may be subject to desirable limitations. For example, the stability of a linear voltage regulator may be enhanced if its control loop does not respond to output variations at a frequency greater than a given threshold frequency. In other words, in a linear regulator, where the desired voltage output is a DC voltage, the control loop may only respond to output variations below a given threshold frequency, such as frequencies between zero Hz and 100 Hz, just to provide one example. Consequently, a linear voltage regulator may be characterized, in part, has having a bandwidth, in that the feedback may only react to voltage changes having a frequency within that bandwidth, for example, frequencies below a threshold frequency.

In addition, a circuit in which a linear voltage regulator is employed may have some tolerance for excursions on the output voltage. For example, if a regulator has a nominal output voltage of 3 volts, excursions of plus or minus 0.1 volts may be tolerable.

In FIG. 1, the voltage regulator 101 produces a regulated voltage output on output terminal 102. That output terminal 102 may be a pad on an integrated circuit, or a solder ball or lead on an integrated circuit's package. The output terminal 102, in turn, is electrically coupled to an external capacitor 110. The external capacitor 110 may be provided with, and as part of, an integrated circuit voltage regulator (e.g., regulator 101), or may be supplied by the user of the regulator, for example as part of a greater circuit in which the regulator is applied.

In operation, the output terminal 102 is coupled to a load 111, to which the regulator 101 supplies its regulated voltage output. The load may use the regulated output voltage as a reference voltage or as a power source, to name but a few examples. Note that, in this embodiment, the external capacitor 110 is independent of the load. Indeed, the regulator 101 and capacitor 110 are capable of performing their respective functions even if no load 111 is coupled to the regulator output 102.

The system 100 of FIG. 1 also includes components configured to detect whether the capacitor 110 is coupled to the regulator's output 102. Stated alternately, the components can determine whether the capacitor 110 is missing.

Perturbation circuit 120 perturbs the output voltage at the regulator's output 102. The characteristics of the perturbation caused by the perturbation circuit 120 are such that the perturbation will not cause a material change in the regulator's voltage output (for example, would not impair normal operation of the regulator, or cause the regulator's regulated voltage output to violate its noise specification), if the capacitor 110 is in electrical contact with the regulator's output 102. For example, the perturbation may cause a small fluctuation in the voltage at the regulator's output 102, but that fluctuation will be within the tolerance of the regulator, and its load (if present).

On the other hand, if the capacitor 110 is not in electrical contact with the regulator's output terminal 102, then the perturbation caused by the perturbation circuit 120 is detected by spike detector circuit 130, which is also in electrical contact with the regulator's output terminal 102. The spike detector circuit 130 may, in turn, produce a signal 132 at its output terminal 131. The output signal 132 may, for example, be a control signal that causes the regulator 101 to stop providing its output voltage at its output terminal 102. Alternately, the output signal 132 may be a message ("Cap Fail flag") that indicates that the capacitor 110 is not, or is no longer, in electrical contact with the output terminal 102. In some embodiments, the output signal 132 may alert a user. In some embodiments, the output signal 132 may be supplied to another circuit, and possibly even to the load 111, which may take action in response to the output signal 132. As one example, if load 111 includes an automobile safety system, such as crash sensor for an airbag system or a gyroscope for a stability control system, the output signal may alert the driver that the safety system is compromised, or even take some or all of the safety system offline.

Some embodiments include a bandpass filter 125 having a frequency cutoff to pass the frequency of a perturbation signal and to block the regulated DC voltage 102 of the regulator, to thereby produce a filtered signal. The spike detector 130 then assesses the voltage transient on the filtered signal at the voltage output node 102.

Figure 2A:
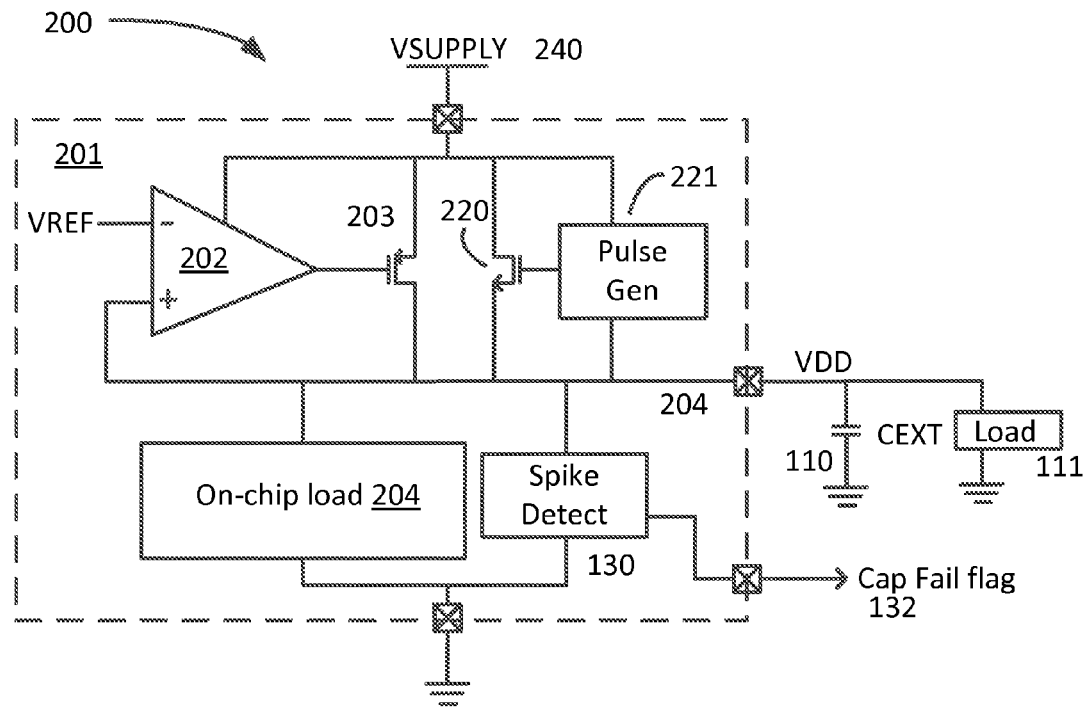
FIGS. 2A-2B schematically illustrate an embodiment of a system for detecting the presence of an off-chip capacitor.

FIG. 2A schematically illustrates an embodiment of a regulator system 200, including a linear voltage regulator 202 and associated pass transistor 203. In this embodiment, the regulator and some other components are all within an integrated circuit package 201, and may even be on a single integrated circuit. The system 200 may optionally include an on-chip load 204 (which may be an analog circuit or a digital circuit, for example), and/or an external load 111, electrically coupled to the regulator's output terminal 102.

In this embodiment, the perturbation circuit 120 includes a pulse generator 221 operatively coupled to a perturbation transistor 220. The perturbation transistor 220, in turn, is coupled between a voltage supply 240, which supplies power to the regulator 202, perturbation transistor 220, and other components of the system 200. In operation, the pulse generator 221 provides a pulse to the perturbation transistor 220, causing the perturbation transistor 220 to conduct, for the duration of the pulse, current from the voltage supply 240 to the regulator output 102. Because the pulse is of a limited duration, the amount of charge delivered to the regulator output 102 is limited. The charge so delivered may be referred to as a charge packet, and the circuitry that produces the charge packet may be characterized as a charge packet source.

If the capacitor 110 is in electrical contact with the regulator output terminal 102, then the charge packet will cause the voltage across the capacitor 110 to rise slightly as a voltage spike, in accordance with the well-known equation: $q=CV$, such that the voltage spike may be calculated as $V=q/C$, where "q" is the amount of charge in the charge packet, "C" is the capacitance of the capacitor 110, and V is the amplitude of the voltage spike.

Figure 2B:
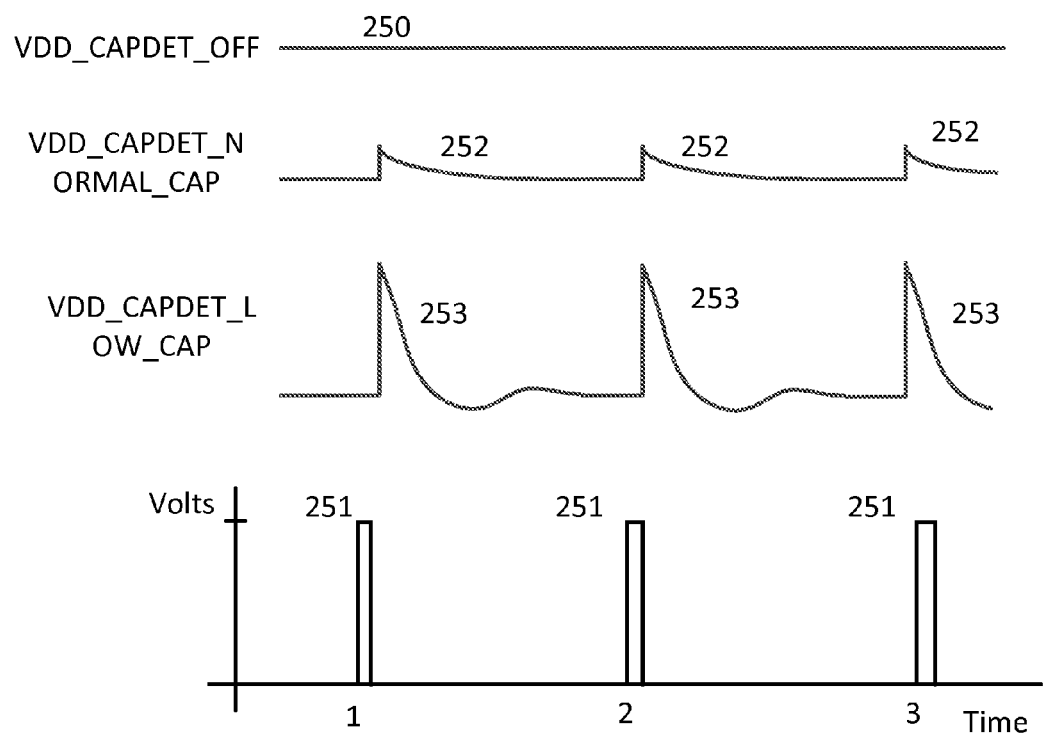

Illustrative examples of various signals described above are schematically illustrated in FIG. 2B. Under normal operation, the regulator 202 produces steady, regulated voltage 250 at its output terminal 102. In accordance with the embodiment of FIG. 2A, the pulse generator 221 provides one or more pulses 251 (e.g., the pulse generator 221 may produce a series of control pulses 251) to the perturbation transistor 220 which responds as described above by delivering a charge packet (or a series of discrete charge packets) to the regulator output terminal 102. If the capacitor 110 is in electrical contact with the regulator output terminal 102, the charge packet causes a corresponding small voltage spike 252. In, on the other hand, the capacitor 110 is not in electrical contact with the regulator output terminal 102, the charge packet causes a larger voltage spike 253.

An embodiment of spike detector 130, in turn, detects the larger voltage spike 253 to create the output signal 132, but does not react to a smaller voltage spike 252. In this way, the system 200 may periodically or continuously determine whether the capacitor 110 is or remains in electrical contact with the regulator output terminal 102, and produce an output signal 132 if not. To that end, the perturbation circuit may produce perturbations (in this case, charge packets) occasionally, periodically, or aperiodically. In some embodiments, however, the pulse width and/or frequency of such perturbations are configured to fall outside of the bandwidth of the regulator 202, so that the regulator's control loop does not respond to the perturbations, or any single one of the perturbations, and thereby disturb the desired regulated output voltage of the regulator 202. In some embodiments in which the regulator provides voltage to a circuit (such as and on-chip load 204 or an external load 111) that has a signal bandwidth, or which processes as signal having a signal bandwidth, the timing (frequency) of such perturbations are configured to fall outside of the signal bandwidth.

Generally, the magnitude of the perturbation (e.g., the amount of charge in the charge packet) may be determined by a system designer, so that the voltage spikes 252 are within the tolerance of the system in which the regulator 202 is used. As described above, the amount of charge, and therefore the operating parameters of the pulse generator 221 (e.g., duration of pulses 251; frequency of pulses 251), and the specification of the perturbation transistor 220 or the external capacitor 110, may be determined by the capacitor equations described above. Although the pulses 250 are illustrated as a square wave, other embodiments that generate periodic perturbations may generate such perturbations in response to other periodic signals, such as a sinusoid of triangle-wave, to name but a few examples.

The components and timing of operation of a regulator system, such as regulator system 100 or 200 to name just two examples, can be specified by the designer of the regulator and/or the designer of a load circuit to be supplied by the regulator, depending on the load and desired operational characteristics of the system and its components. As just one example, a capacitor 110 may have a value of 1 uF (micro Farad). The load may have a signal bandwidth of 400 Hz (e.g., from 0 Hz to 400 Hz). A perturbation may source to the capacitor 110, or sink from the capacitor 110, a discreet charge packet having a charge of 5 nC (nano Coulombs), and a width of 500 nS (nanoseconds) to 1 uS (microsecond). Perturbations may be applied one at a time, or at a frequency of 1 kHz, 2 kH, 4 kHz or 8 kHz, to name but a few examples.

Figure 3A:
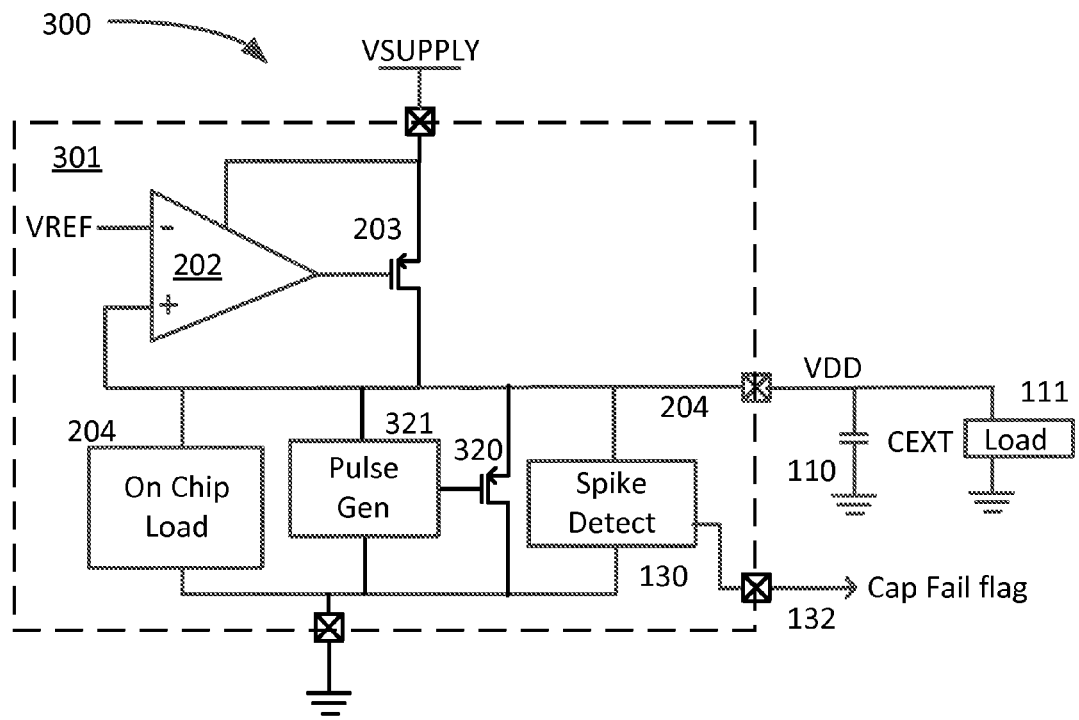
FIGS. 3A-3B schematically illustrate another embodiment of a system for detecting the presence of an off-chip capacitor.
Figure 3B:
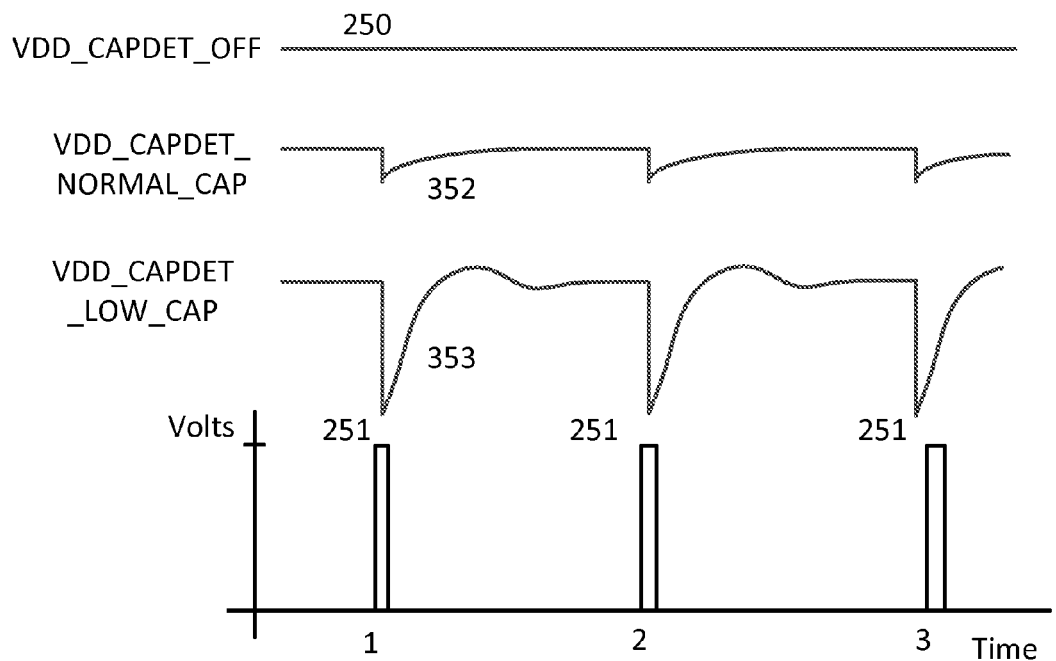
Figure 3C:
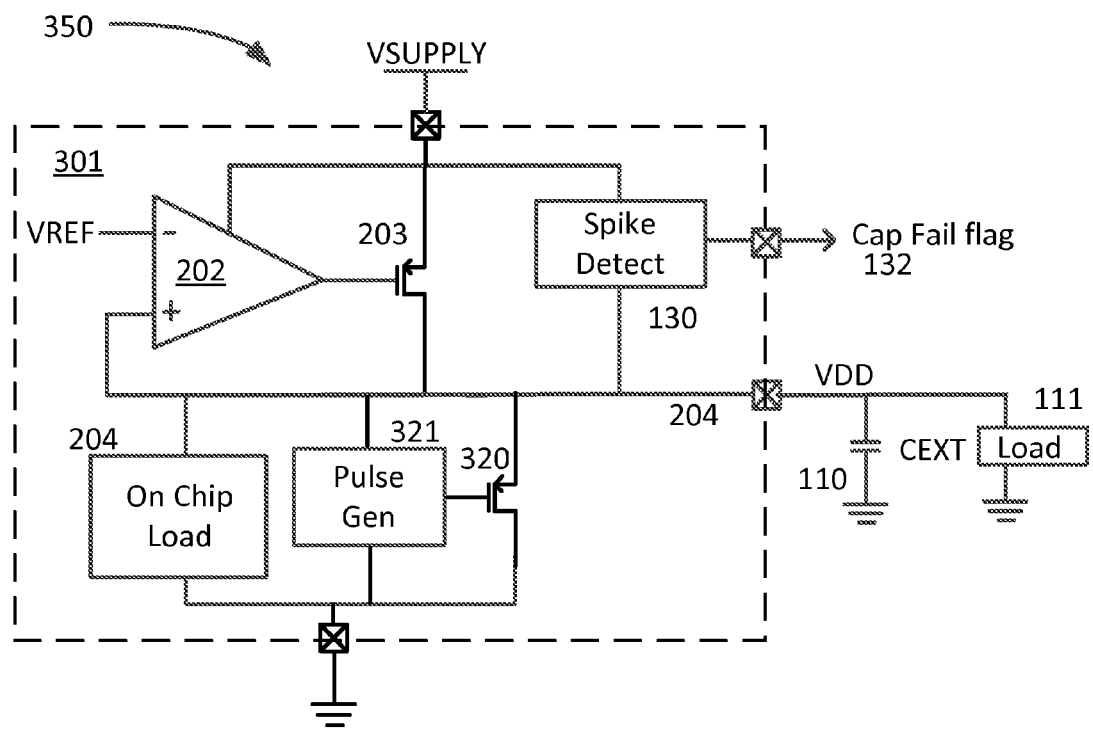
FIG. 3C schematically illustrates another embodiment of a system for detecting the presence of an off-chip capacitor.
Figure 3D:
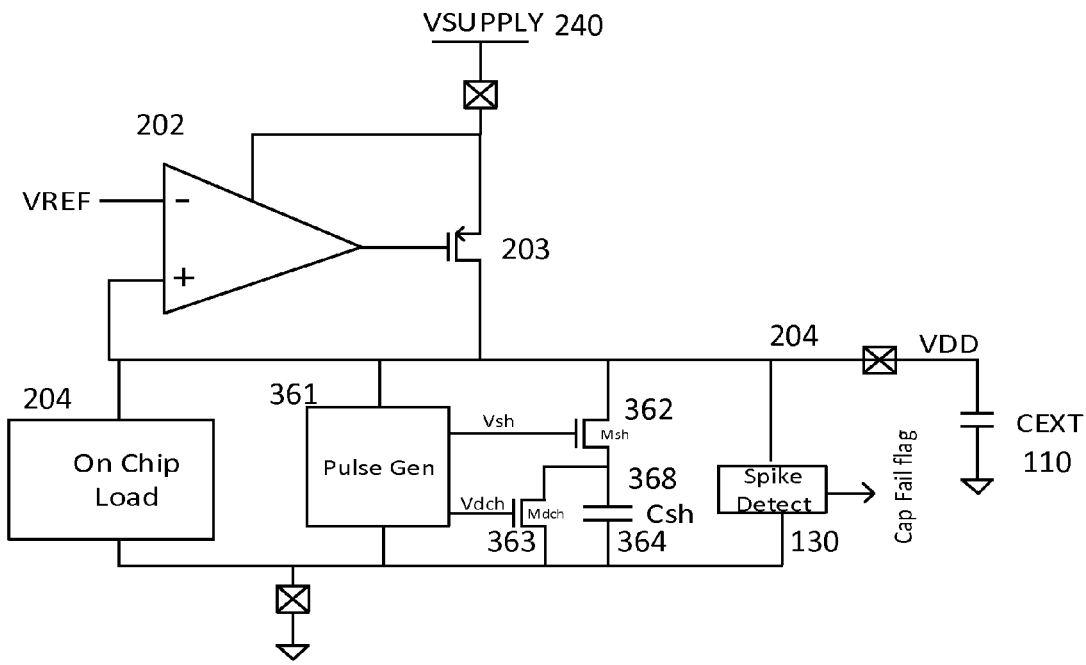
FIGS. 3D-3E schematically illustrate another embodiment of a system for detecting the presence of an off-chip capacitor.
Figure 3E:
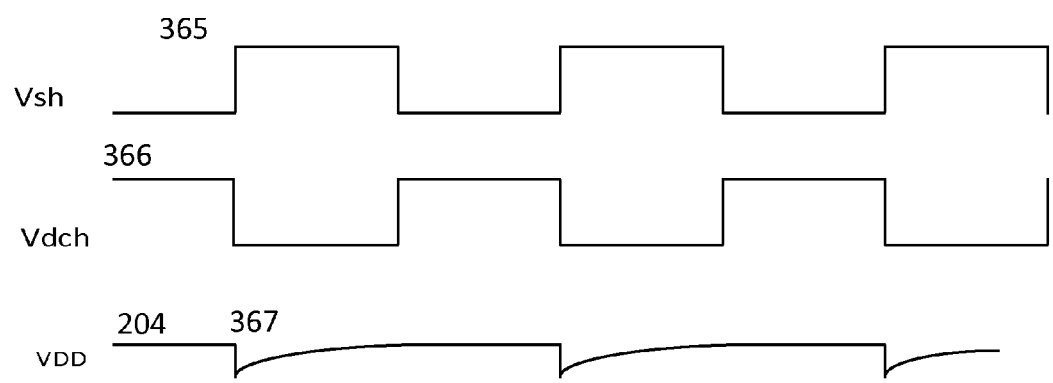

An alternate embodiment of a perturbation generator is schematically illustrated by FIG. 3D and FIG. 3E. In this embodiment, a pulse generator 361 provides complementary (preferably, non-overlapping) drive signals 365 (which may be referred to as "Vsh) and 366 (which may be referred to as "Vdch") to switches 362 (which may be referred to as "Msh," and which may be a MEMS switch, mechanical switch, or a transistor, to name but a few examples) and 363 (which may be referred to as "Mdch," and which may be a MEMS switch, mechanical switch, or a transistor, to name but a few examples), respectively. The drive signals 365 and 366 may be a clock signal and its inverse, respectively. In some embodiments, pulse generator or 361 may be a state machine.

In operation, when drive signal 366 is high and drive signal 365 is low, switch 363 is closed with the result that node 368 coupled to ground and the voltage across packet capacitor 364 (which may be referred to as "Csh") is zero volts. Capacitor 364 may be on-chip or off-chip, and is, in this embodiment, smaller than capacitor 110 by a factor of 1000 (i.e., if capacitor 110 is 1 micro Farad, then packet capacitor 364 is 1 nano-Farad). In this configuration, switch 362 is open so that node 368 is not in electrical communication with Vdd 204.

When drive signal 366 is low and drive signal 365 is high, switch 363 is open, with the result that node 368 is not coupled to ground through switch 363. In this configuration, switch 362 is closed, so that node 368 is coupled to Vdd 204, and therefore is in electrical communication with capacitor 110. More specifically, packet capacitor 364 is in parallel with capacitor 110, so that some of the charge on capacitor 110 flows from capacitor 110 into packet capacitor 364, resulting in a negative-going spike 367 in Vdd 204. In the absence of capacitor 110, the negative-going spike 367 would be larger, and detectable by a spike detector as described herein. Packet capacitor 364 and the foregoing circuitry therefore form an embodiment of a controllable charge packet source.

Figure 3F:
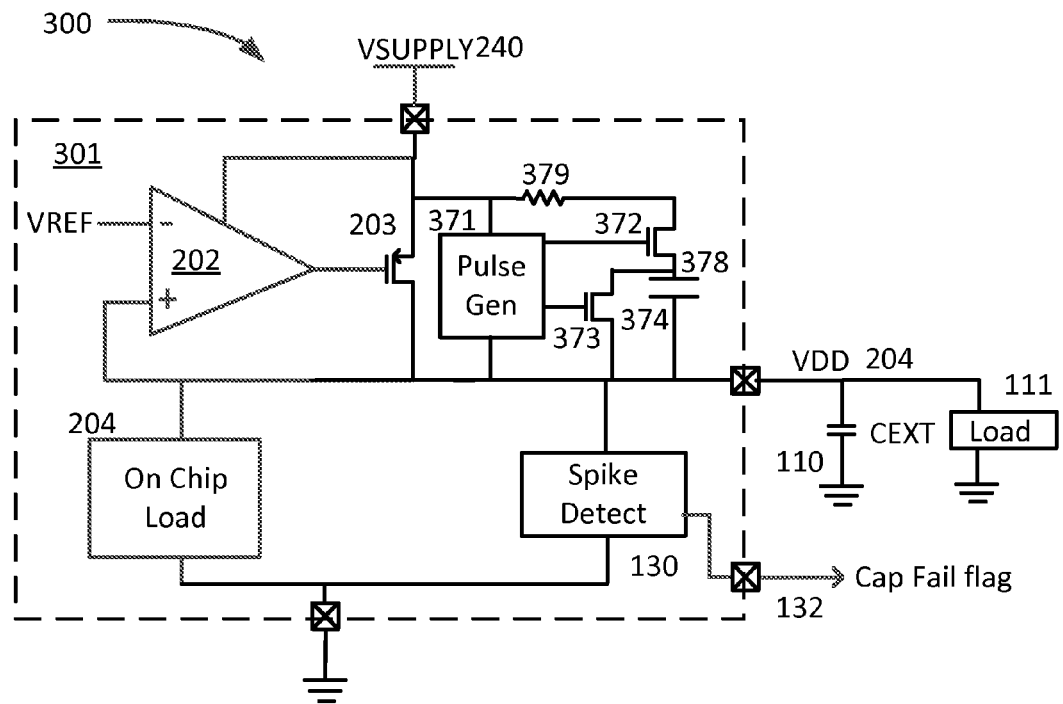
FIGS. 3F-3G schematically illustrate an embodiment of a system for detecting the presence of an off-chip capacitor.
Figure 3G:
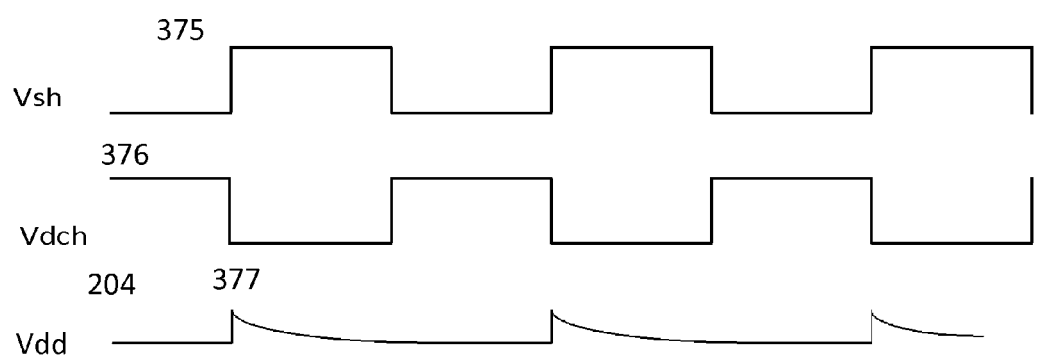

Yet another embodiment of a perturbation generator is schematically illustrated by FIG. 3F and FIG. 3G. In this embodiment, a pulse generator 371 provides complementary drive signals 375 and 376 to switches 372 and 373, respectively. Switches 372 and 373 may be MEMS switches, mechanical switches, or transistors, to name but a few examples.

The drive signals 375 and 376 may be a clock signal and its inverse, respectively. In some embodiments, pulse generator or 371 may be a state machine.

In operation, when drive signal 375 is high and drive signal 376 is low, switch 372 is closed, so that packet capacitor 374 is coupled to Vsupply 240 through resistor 379, and switch 373 is open. In this configuration, packet capacitor 374 receives charge flow from Vsupply 240, and the resulting charge on packet capacitor 374 is a charge packet.

Figure 4A:
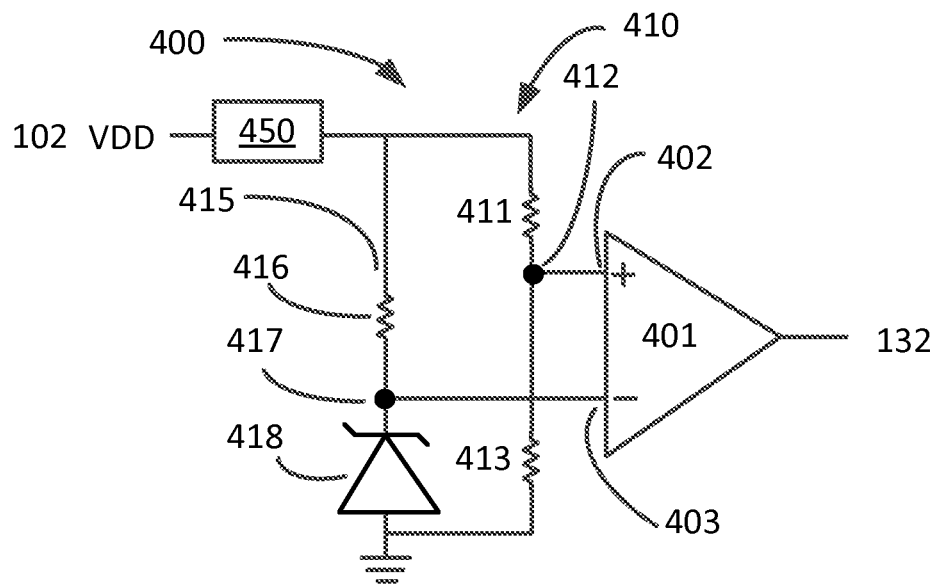
FIGS. 4A-4B schematically illustrate embodiments of spike detectors.

When drive signal 375 is low and drive signal 376 is high, switch 372 is open so that packet capacitor 374 is not coupled to Vsupply. In this configuration, switch 373 is closed so that node 378 is coupled to Vdd 204, and therefore to capacitor 110. Consequently, charge packet flows from packet capacitor 374 to capacitor 110, resulting in positive-going spike 377 on output voltage Vdd 204. In the absence of capacitor 110, the positive-going spike 377 would be larger, and detectable by a spike detector as described herein. Packet capacitor 374 and the foregoing circuitry therefore form an embodiment of a controllable charge packet source. An embodiment 400 of a spike detector circuit 130 is schematically illustrated in FIG. 4A, and includes a comparator 401. A voltage divider circuit 410 composed of resistors 411 and 413 define a node 412 coupled to a positive input 402 of the comparator 401. The voltage divider 410 is coupled between to the regulator output 102 and ground, so that the voltage at the voltage divider node 412 is a fraction of the voltage output of the regulator (defined as the resistance of resistor 411 divided by the sum of resistances 411 and 413).

A voltage reference circuit 415 is also coupled between to the regulator output 102 and ground, and in this example includes a resistor 416 in series with a zener diode 418, to define a node 417. The voltage at the node 417 is defined by the zener diode, and does not depend on the output voltage of the regulator 202, provide that such output voltage is sufficient to produce a current through the zener diode 418. By selection of the values of the voltage characteristics of the zener diode 418, and the resistances of the resistors 411, 413 and 416, respectively, the comparator 401 may be configured to produce output signal 132 if the output voltage of the regulator 202 exceeds a threshold defined by resistors 411 and 413.

Figure 4B:
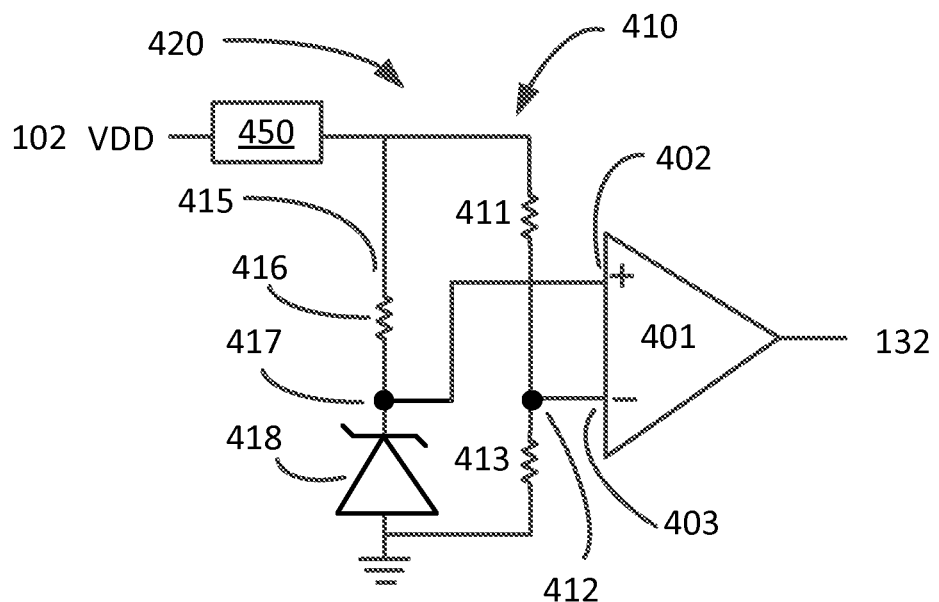

Some embodiments of spike detectors 130 (e.g., the spike detector 400 of FIG. 4A or other embodiments of spike detectors described herein) may be coupled to a regulator output 102 via an optional mitigating element 450. Such mitigating elements are schematically illustrated in FIG. 4A and FIG. 4B, but could apply to any embodiment described herein.

For example, in some embodiments, when the regulated output voltage at output node 102 of the regulator 101 is perturbed on a periodic basis (e.g., the perturbations have a frequency), the limiting element 450 may be a band pass filter configured to pass signals with a frequency equal to the frequency of the perturbations and to block the regulated DC voltage.

In other embodiments, the limiting element may be a switch that controllably couples and decouples the regulator output 102 to the detector circuit 130. In operation such a switch couples the regulator output 102 to the detector circuit 130 at or about times when the regulator output is perturbed, and decouples the regulator output 102 from the detector circuit 130 at other times. For example, the pulses 251 from pulse generator 221 of FIG. 2B, for example, could cause the switch 450 to close and thereby electrically connect the regulator output 120 to the spike detector 130. Such embodiments mitigate the risk that the spike detector 130 might erroneously react to other disturbances on the regulator's output 102, such as disturbances at a frequency other than the frequency of the perturbations, or disturbances that fall at a time other than a time of a perturbation.

FIG. 3A schematically illustrates an embodiment of a regulator system 300, also including linear voltage regulator 202 and associated pass transistor 203. In this embodiment, the regulator and some other components are all within an integrated circuit package 301, and may even be on a single integrated circuit. The system 300 may optionally include an on-chip load 204 (which may be an analog circuit or a digital circuit, for example), and/or an external load 111, electrically coupled to the regulator's output terminal 102.

In contrast to the embodiment of FIG. 2A, in which a charge packet source injects a charge packet into the regulator's output, the embodiment 300 of FIG. 3A extracts (or "sinks") a charge packet from that output voltage, thereby causing a negative voltage spike not the output, as schematically illustrated in FIG. 3A. In this embodiment, the perturbation circuit 120 includes a pulse generator 321 operatively coupled to a perturbation transistor 320. The perturbation transistor 320, in turn, is coupled between regulator output 102 and ground. In operation, the pulse generator 321 provides a pulse to the perturbation transistor 320, causing the perturbation transistor 320 to conduct, for the duration of the pulse, current from the regulator output 102 to ground. As such, the transistor 320 sinks the charge packet. Because the pulse is of a limited duration, the amount of charge extracted from the regulator output 102 is limited. The charge so extracted may be referred to as a charge packet, and the circuitry that produces the charge packet may be characterized as a charge packet source.

If the capacitor 110 is in electrical contact with the regulator output terminal 102, then the extraction of the charge packet will cause the voltage across the capacitor 110 to rise slightly drop, as a negative-going, in accordance with the well-known equation: q=CV, such that the voltage spike may be calculated as V=q/C, where "q" is the amount of charge in the charge packet, "C" is the capacitance of the capacitor 110, and V is the amplitude of the voltage spike.

Illustrative examples of various signals described above are schematically illustrated in FIG. 3B. Under normal operation, the regulator 302 produces steady, regulated voltage 250 at its output terminal 102. In accordance with the embodiment of FIG. 3A, the pulse generator 321 provides one or more pulses 351 (e.g., the pulse generator 321 may produce a series of control pulses 351) to the perturbation transistor 320 which responds as described above by extracting a charge packet (or a series of discrete charge packets) from the regulator output terminal 102.

If the capacitor 110 is in electrical contact with the regulator output terminal 102, the charge packet causes a corresponding small voltage spike 352. If, on the other hand, the capacitor 110 is not in electrical contact with the regulator output terminal 102, the charge packet causes a larger voltage spike 353.

An embodiment of spike detector 130, in turn, detects the larger voltage spike 353 to create the output signal 132, but does not react to a smaller voltage spike 352. In this way, the system 300 may periodically or continuously determine whether the capacitor 110 is or remains in electrical contact with the regulator output terminal 102, and produce an output signal 132 if not. To that end, the perturbation circuit may produce perturbations (in this case, charge packets) occasionally, periodically, or aperiodically. In some embodiments, however, the timing (frequency) of such perturbations falls outside of the signal bandwidth of the circuit to which the regulator 202 supplies voltage. Generally, the magnitude of the perturbation (e.g., the amount of charge in the charge packet) may be determined by a system designer, so that the voltage spikes 352 are within the tolerance of the system in which the regulator 202 is used. As described above, the amount of charge, and therefore the operating parameters of the pulse generator 321 (e.g., duration of pulses 251; frequency of pulses 251), and the specification of the perturbation transistor 320 or the external capacitor 110, may be determined by the capacitor equations described above.

An embodiment 420 of a spike detector circuit 130 is schematically illustrated in FIG. 4B, and includes the same components as the embodiment 400 of a spike detector circuit 130 of FIG. 4A. In FIG. 4B, however, the connections to the inputs 402 and 403 of the comparator 401 are the opposite of the connections in FIG. 4A, so that the comparator 401 produces output signal 132 if the spike 353 drops to a voltage below a threshold established by voltage reference circuit 415.

Alternate Embodiments of Spike Detectors

Figure 2C:
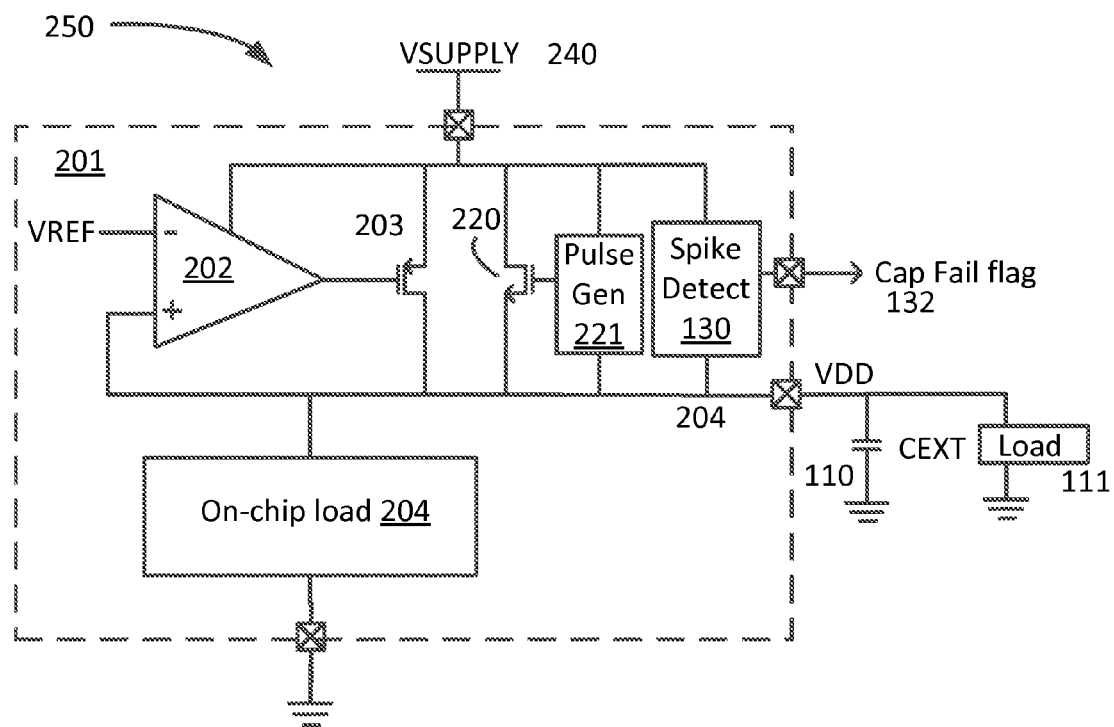
FIG. 2C schematically illustrates an alternate embodiment of a system for detecting the presence of an off-chip capacitor.

Various embodiments of spike detectors may detect voltage spikes on a regulator output by detecting such spikes relative to ground (as in spike detectors 130 in circuit 200 in FIG. 2A and in circuit 300 in FIG. 3A, and 400 in FIG. 4A, and spike detector 420 in FIG. 4B, for example), or between a regulator output and a power supply (as in spike detectors 130 in FIG. 2C and circuit 350 of FIG. 3C, for example).

In addition, some embodiments of spike detectors convert a voltage to several internal currents. When there is no voltage spike, the currents within such spike detectors remain static, as if in equilibrium. When a voltage spike occurs, however, the various internal currents change so that the currents are no longer balanced. Such transient current imbalances (i.e., current imbalances caused by a voltage spike) may be detected, for example as described below. Consequently, such circuits may be described as transconductance, dynamically unbalanced spike detector circuits, because they convert regulator (or spike) voltage to currents (e.g., a transconductance operation) and the currents become unbalanced in response to a voltage spike (e.g., the currents are dynamically unbalanced).

Alternate embodiments are described below.

Figure 5H:
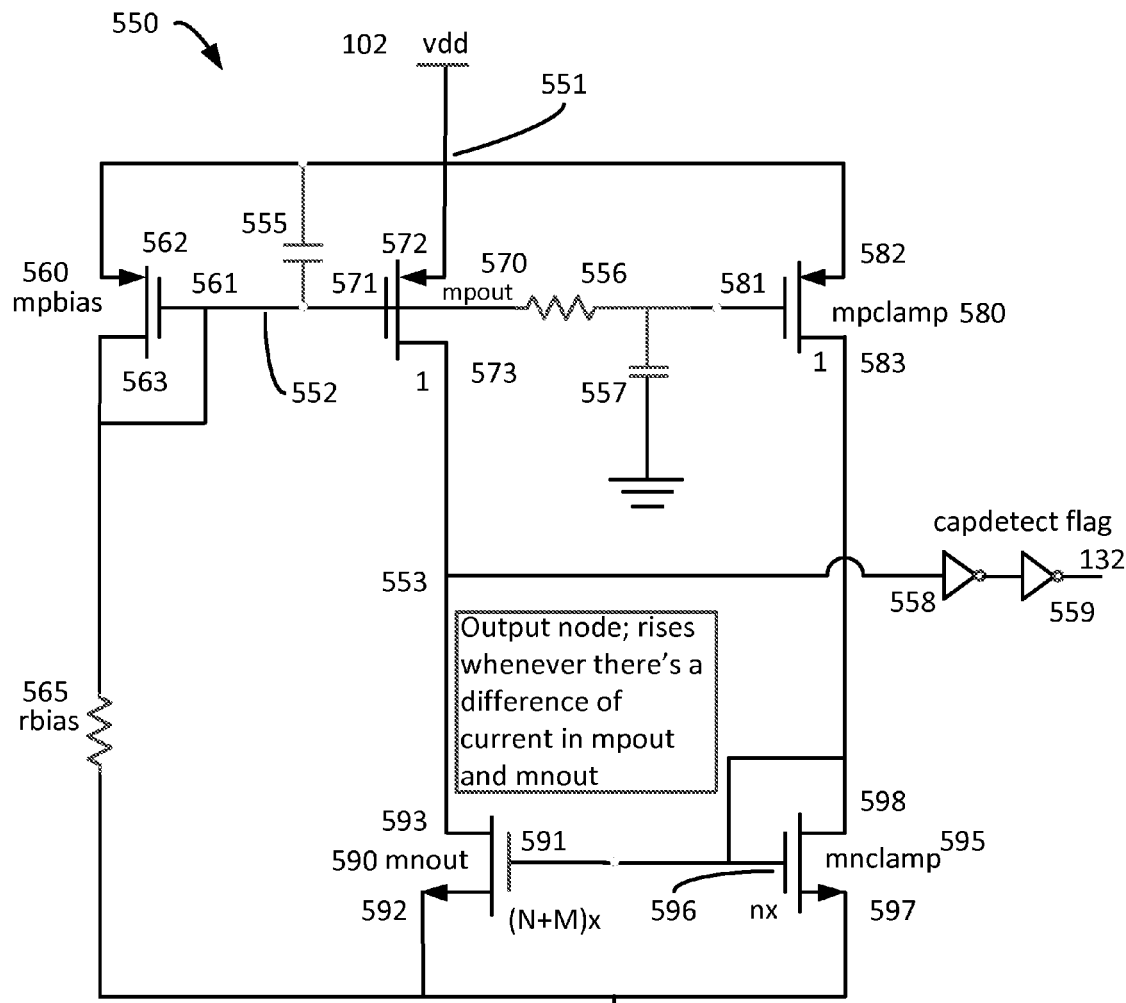
Figure 5H:
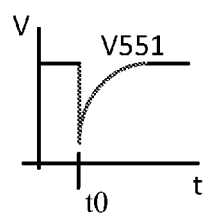

FIG. 5A: Positive-Going Spike Detector

Another embodiment of a spike detector circuit 500 is schematically illustrated in FIG. 5A, and is configured to detect a positive-going spike. An input node 501 to the circuit 500 is electrically coupled to the voltage output 102 of the regulator 101, and also coupled to the sources (512, 522, and 532, respectively) of three P-channel transistors 510 (which may be referred to as "mpbias," and which has gate 511, source 512, and drain 513), 520 (which may be referred to as "mpout," and which has gate 521, source 522, and drain 523), and 530 (which may be referred to as "mpclamp," and which has gate 531, source 532, and drain 533).

In this configuration, and when no perturbation is applied to the voltage output 102 of the regulator 101, transistor 510 conducts current to resistor 565 (which may be referred to as "rbias"), which is coupled to ground. That current may be referred to as the "reference current" (or "bias current") and causes a voltage at the node 502, which voltage is equal to the voltage across resistor 565.

The gates 521 and 531 of transistor 520 and 530, respectively, are each electrically coupled to node 502, and each transistor 520 and 530 mirrors the reference current through transistor 510. In this embodiment, the transistors 520 and 530 each produce, at their drains 523 and 533 respectively, a current identical to the reference current.

The drain 523 of transistor 520 is electrically coupled to the drain 543 of N-channel transistor 540, forming node 503, and the drain 533 of transistor 530 is electrically coupled to the drain 548 of N-channel transistor 545.

The gates 541 and 546 of transistors 540 and 545, respectively, are coupled to each other, and to the drain 548 of transistor 545, so that transistor 540 mirrors the current through transistor 545. However, transistor 545 is slightly larger than transistor 540 such that the ratio of the size of transistor 545 to transistor 540 is N/(N−M), and therefore transistor 540 is configured to sink less current than flows through transistor 545. In this example, the ratio of the current through transistor 545 to the current mirrored in, and sunk by, transistor 540 is equal to the ratio of their sizes: N/(N−M).

As described above, the current provided to transistor 540 from transistor 520 is identical to the current provided to transistor 545 from transistor 530, so the current available for transistor 540 is more than transistor 540 is configured to sink, because of the relative sizes of transistors 540 and 545. Consequently, in this configuration, the drain-source voltage across transistor 540 is not low (e.g., transistor 540 is not in triode mode but 520 is), with the result that the voltage of node 503 not held close to ground, but is closer to Vdd. Consequently, inverters 558 and 559, which are coupled in series to node 503, produce a logic one at output 132.

When the voltage output 102 reacts to a perturbation with a positive-going spike, such as spike V501 at time t0 (FIG. 5B; which represents a positive-going voltage spike at node 501) for example, the current flows through the circuit 500 change. The gate 511 of transistor 510 and the gate 521 of transistor 520 are coupled to the output 102 of the linear regulator 505 through capacitor 505. Consequently, the voltage spike at node 502 (schematically illustrated as positive-going voltage spike V502 in FIG. 5C) causes a slight, but negligible drop in the current through transistor 510, and transistor 520 continues to mirror that current as described above. In the case of transistors 510 and 520, both the gate (511 and 521, respectively) and source (512 and 522, respectively) undergoes substantially identical voltage spikes (FIG. 5C and FIG. 5B, respectively). Thus the gate-source voltage for each of transistors 510 and 520 is almost the same as before the spike. It is the gate-source voltage that determines the current in the transistor and since this does not change much, neither does the current through those transistors 510 and 520.

However, resistor 556 and capacitor 557 form a filter that attenuates the voltage spike between node 502 and the gate 531 of transistor 530, with the result that the voltage spike at the gate 531 of transistor 530 (schematically illustrated as positive-going voltage spike V531 in FIG. 5D) is smaller than (i.e., has a smaller amplitude than) the voltage spike at node 501. In the case of transistor 530, the voltage spike in the source 532 is the same as that applied to the sources 512 and 522 of transistors 510 and 520 (FIG. 5B), but the spike in the gate 531 is smaller (because of the RC filter formed by resistor 556 and capacitor 557). Thus the gate-source voltage of transistor 530 (i.e., V532-V531 at t0) increases by an amount sufficient to increase the current through transistor 530. Consequently, the current through transistor 530 is more than as described above for the no-perturbation state and, in turn the current into through transistor 545 is increased, and further, the current through transistor 540 is also increased. The threshold of spike amplitude to which the spike detector 500 reacts in this way may established (or "predetermined") by parameters of various circuit components. For example, the amount by which spike is attenuated by the filter formed by resistor 556 and capacitor 557 may be determined by the value of the resistor 556 and/or the value of the capacitor 557. Those values are established by the circuit's designer, for example to meet a specification, or to meet the needs of the system in which the spike detector will be used. In short, the greater the attenuation, the smaller the spike needed to trigger the spike detector to produce a capdetect flag at output 132.

As described above, transistor 540 is smaller than transistor 545 such that the current mirrored by transistor 540 is smaller than the current through transistor 545. Nevertheless, as part of the current mirror formed by transistor 545 and transistor 540, during a supply spike transistor 540 is configured to sink more current than is conveyed to the drain 543 of transistor 540 via transistor 520, with the result that the drain-source voltage across transistor 540 drops, producing an impulse (schematically illustrated as negative-going voltage spike V503 in FIG. 5E) at node 503. The voltage at node 503 drops to a point low enough that inverters 558 and 559, which are coupled in series to node 503, produce a logic zero, which may be known as the "capdetect flag" (schematically illustrated as positive-going voltage signal V132 in FIG. 5F) at output 132.

As an example, in some embodiments, the reference current produced by transistor 510 may be 10 micro-Amps, so that the mirrored current at the drain 523 of transistor 520 is also 10 micro-Amps, and the mirrored current at the drain 533 of transistor 530 is also 10 micro-Amps, when there is no perturbation on output 102. When there is a perturbation on output 102, the reference current produced by transistor 510 may be 10 micro-Amps, so that the mirrored current at the drain 523 of transistor 520 may remain close to 10 micro-Amps, and the mirrored current at the drain 523 of transistor 520 also remains about 10 micro-Amps. However, the mirrored current at the drain 533 of transistor 530 may increase to about 15 micro-Amps.

Consequently, the input current to the current mirror formed by transistors 540 and 545, at the drain 548 of transistor 545, is about 15 micro-Amps, such that the transistor 540 would sink 15 micro-Amps if that amount of current were available to transistor 540, but since transistor 510 provides only 10 micro-Amps to transistor 540, the drain-source voltage across transistor 540 drops, bringing node 503 closer to ground, in.

FIG. 5G: Negative-Going Spike Detector

Another embodiment of a spike detector circuit is schematically illustrated in FIG. 5G, and is configured to detect a negative-going spike. An input node 551 to the circuit 550 is electrically coupled to the voltage output 102 of the regulator 101, and also coupled to the sources (562, 572, and 582, respectively) of three P-channel transistors 560 (which may be referred to as "mpbias," and which has gate 561, source 562, and drain 563), 570 (which may be referred to as "mpout," and which has gate 571, source 572, and drain 573), and 580 (which may be referred to as "mpclamp," and which has gate 581, source 582, and drain 683).

In this configuration, and when no perturbation is applied to the voltage output 102 of the regulator 101, transistor 560 conducts current to resistor 565 (which may be referred to as "rbias"), which is coupled to ground. That current may be referred to as the "reference current" (or "bias current") and causes a voltage at the node 552, which voltage is equal to the voltage across resistor 565.

The gates 571 and 581 of transistor 570 and 580, respectively, are each electrically coupled to node 552, and each transistor 570 and 580 mirrors the reference current through transistor 560. In this embodiment, the transistors 570 and 580 each produce, at their drains 573 and 583 respectively, a current identical to the reference current.

The drain 573 of transistor 570 is electrically coupled to the drain 593 of N-channel transistor 590, forming node 553, and the drain 583 of transistor 580 is electrically coupled to the drain 598 of N-channel transistor 595.

The gates 591 and 596 of transistors 590 and 595, respectively, are coupled to each other, and to the drain 598 of transistor 595, so that transistor 590 mirrors the current through transistor 595. However, transistor 590 is slightly larger than transistor 595, so transistor 590 is configured to sink more current than transistor 595. In this example, if transistor 595 sinks a quantity of current "N," transistor 590 is configured to sink a quantity of current "N+m."

As described above, the current provided to transistor 590 from transistor 570 is identical to the current provided to transistor 595 from transistor 580, so the current available for transistor 590 is less than transistor 590 is configured to sink. Consequently, in this configuration, the drain-source voltage across transistor 590 is very low, with the result that the voltage of node 553 is very close to ground. Consequently, inverters 158 and 159, which are coupled in series to node 553, produce a logic zero at output 132.

Figure 5I:
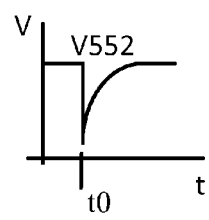

When the voltage output 102 reacts to a perturbation with a negative-going spike, such as spike V551 (FIG. 5H, which represents a negative-going voltage spike at node 551) for example, the current flows through the circuit 550 change. The gate 561 of transistor 560 and the gate 571 of transistor 570 are coupled to the output 102 of the linear regulator through capacitor 555. Consequently, the voltage spike at node 552 (schematically illustrated as negative-going voltage spike V552 in FIG. 5I) causes a slight, but negligible drop in the current through transistor 560, and transistor 570 continues to mirror that current as described above. In the case of transistors 560 and 570, both the gate (561 and 571, respectively) and source (562 and 572, respectively) undergo substantially identical voltage spikes. Thus the gate-source voltage for each of transistors 560 and 570 is almost the same as before the spike. It is the gate-source voltage that determines the current in the transistor and since this does not change much, neither does the current through those transistors 560 and 570.

Figure 5J:
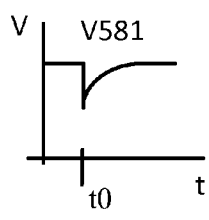

However, resistor 556 and capacitor 557 form a filter that attenuates the voltage spike between node 552 and the gate 581 of transistor 580, with the result that the voltage spike at the gate 581 of transistor 580 (schematically illustrated as negative-going voltage spike V581, FIG. 5J) is smaller (i.e., has a smaller amplitude than) the voltage spike at node 551. In the case of transistor 580, the voltage spike in the source 582 is the same as that applied to the sources 562 and 572 of transistors 560 and 570 (FIG. 5H), but the spike in the gate 581 (FIG. 5J) is smaller (because of the RC filter formed by resistor 556 and capacitor 557). Thus the gate-source voltage of transistor 580 (i.e., V581-V582) decreases by a significant amount, and the current through transistor 580 is decreased accordingly. Consequently, the current through transistor 580 is less than as described above and, in turn the current into through transistor 595 is reduced, and further, the current through transistor 590 is reduced.

Figure 5K:
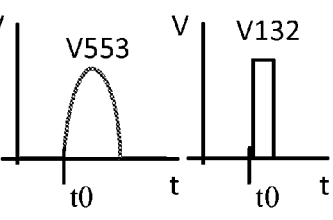
Figure 5L:
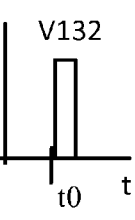

As described above, transistor 590 is larger than transistor 595 such that the current mirrored by transistor 590 is larger than the current through transistor 595. Nevertheless, the current through transistor 590 after the negative going spike at note 551 is still less than the current conveyed to the drain of transistor 590 by transistor 570, with the result that the drain-source voltage across transistor 590 rises, producing a voltage pulse (schematically illustrated as positive-going voltage spike V553; FIG. 5K) at node 553. The voltage at node 553 rises to a point high enough that inverters 555 and 556, which are coupled in series to node 553, produce a logic one, which may be known as the "capdetect flag" (schematically illustrated as positive-going voltage signal V132 in FIG. 5L) at output 132.

As an example, in some embodiments, the reference current produced by transistor 560 may be 10 micro-Amps, so that the mirrored current at the drain 573 of transistor 570 is also 10 micro-Amps, and the mirrored current at the drain 583 of transistor 580 is also 10 micro-Amps, when there is no perturbation on output 102. When there is a perturbation on output 102, the reference current produced by transistor 560 may be 10 micro-Amps, so that the mirrored current at the drain 573 of transistor 570 may remain close to 10 micro-Amps, and the mirrored current at the drain 573 of transistor 570 also remains about 10 micro-Amps. However, the mirrored current at the drain 583 of transistor 580 may drop to about 5 micro-Amps.

Consequently, the input current to the current mirror formed by transistors 590 and 594, at the drain 598 of transistor 595, is about 5 micro-Amps, and the current mirrored by transistor 590 is 6 micro-Amps. Therefore, the drain-source voltage across transistor 590 rises (V553) above the threshold that causes inverter 598 to produce a logic 0, which in turn causes inverter 599 to produce a logic 1 (capdetect flag) at output 132.

Figure 6A:
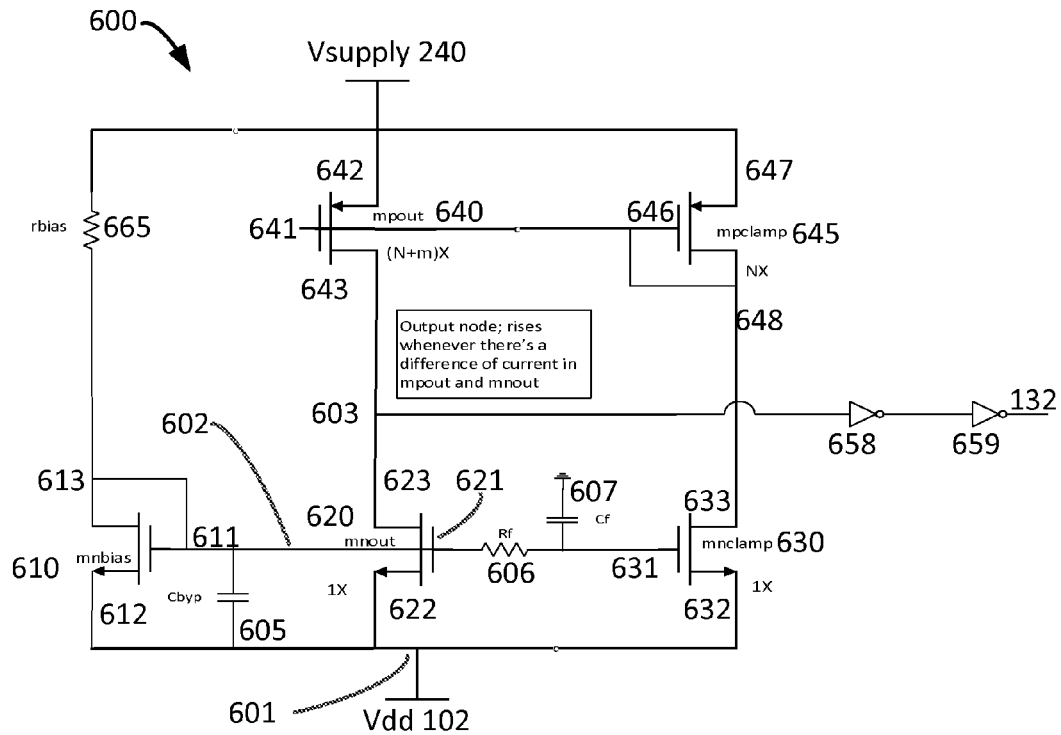
FIGS. 6A-6F schematically illustrate an alternate embodiment of a spike detector.
Figures 6B, 6C, 6D, 6E, 6F:
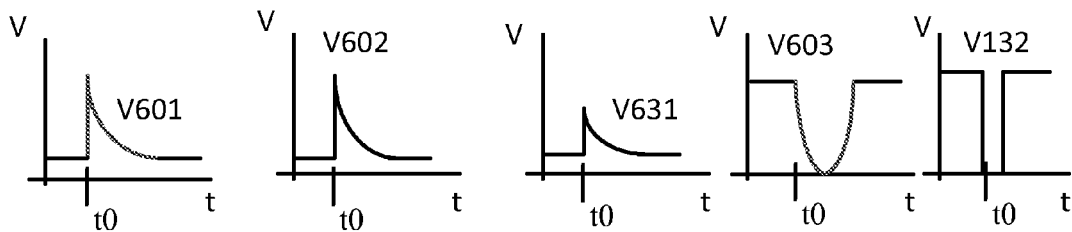
Figure 6G:
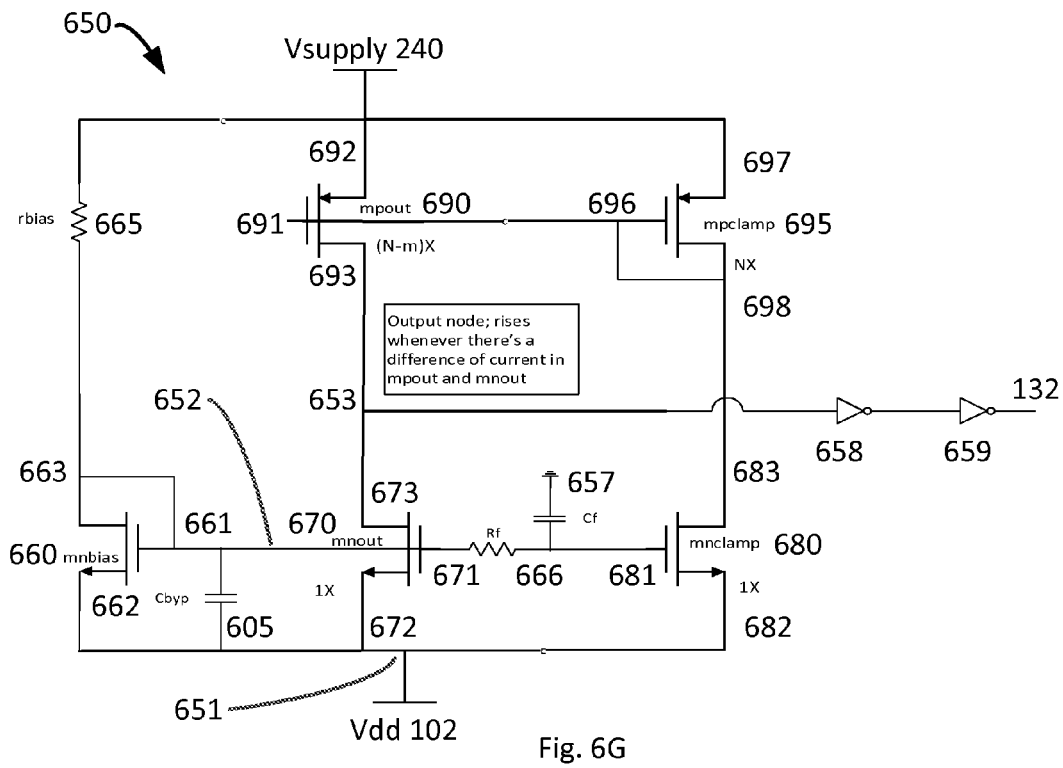
FIGS. 6G-6L schematically illustrate an alternate embodiment of a spike detector.

FIG. 6A and FIG. 6G schematically illustrate embodiments of spike detector circuits disposed between a regulator output and a power supply.

FIG. 6A: Negative-Going Spike Detector

In embodiment 600, schematically illustrated in FIG. 6A, an input node 601 to the circuit 600 is electrically coupled to the voltage output 102 of the regulator 101, and also coupled to the sources (612, 622, and 632, respectively) of three N-channel transistors 610 (which may be referred to as "mnbias," and which has gate 611, source 612, and drain 613), 620 (which may be referred to as "mnout," and which has gate 621, source 622, and drain 623), and 630 (which may be referred to as "mnclamp," and which has gate 631, source 632, and drain 633).

In this configuration, and when no perturbation is applied to the voltage output 102 of the regulator 101, transistor 610 draws current from Vsupply 240 through resistor 565 (which may be referred to as "rbias"). That current may be referred to as the "reference current" (or "bias current") and causes a voltage at the node 602.

The gates 621 and 631 of transistor 620 and 630, respectively, are each electrically coupled to node 602, and each transistor 620 and 630 is thereby configured to mirror the reference current through transistor 610. In this embodiment, the transistors 620 and 630 are each configured to sink, at their drains 623 and 633 respectively, a current identical to the reference current.

The drain 623 of transistor 620 is electrically coupled to the drain 643 of P-channel transistor 640, forming node 603, and the drain 633 of transistor 630 is electrically coupled to the drain 648 of P-channel transistor 645.

The gates 641 and 646 of transistors 640 and 645, respectively, are coupled to each other, and to the drain 648 of transistor 645, so that transistor 640 is configured to mirror the current through transistor 645. However, transistor 645 is slightly smaller than transistor 640, such that the ratio of the size of transistor 645 to transistor 640 is N/(N+m), and therefore transistor 640 is configured to mirror more current than flows through transistor 645. In this example, the ratio of the current through transistor 645 to the current mirrored in transistor 540 is equal to the ratio of their sizes: N/(N+m).

As described above, in the absence of a perturbation, the current provided by transistor 640 to transistor 620 is somewhat greater than to the current provided by transistor 645 to transistor 630. Nevertheless, in this condition, the drain-source voltage across transistor 620 is high, with the result that the voltage of node 603 is very close to Vsupply 240. Consequently, inverters 658 and 659, which are coupled in series to node 603, produce a logic one at output 132.

When the voltage output 102 reacts to a perturbation with a positive-going spike, such as spike V601 at time t0 (FIG. 6B; which represents a positive-going voltage spike at node 601) for example, the current flows through the circuit 600 change. The gate 611 of transistor 610 and the gate 621 of transistor 620 are coupled to the output 102 of the linear regulator through capacitor 605. Consequently, the voltage spike at node 602 (schematically illustrated as positive-going voltage spike V602 in FIG. 6C) causes a slight, but negligible drop in the current through transistor 610, and transistor 620 continues to mirror that current as described above. In the case of transistors 610 and 620, both the gate (611 and 621, respectively) and source (612 and 622, respectively) undergoes substantially identical voltage spikes (FIG. 6C and FIG. 6B, respectively). Thus the gate-source voltage for each of transistors 610 and 620 is almost the same as before the spike. It is the gate-source voltage that determines the current in the transistor and since this does not change much, neither does the current through those transistors 610 and 620.

However, resistor 606 and capacitor 607 form a filter that attenuates the voltage spike between node 602 and the gate 631 of transistor 630, with the result that the voltage spike at the gate 631 of transistor 630 (schematically illustrated as positive-going voltage spike V631 in FIG. 6D) is smaller than (i.e., has a smaller amplitude than) the voltage spike at node 601. In the case of transistor 630, the voltage spike in the source 632 is the same as that applied to the sources 612 and 622 of transistors 610 and 620 (FIG. 6B), but the spike in the gate 631 is smaller (because of the RC filter formed by resistor 606 and capacitor 607). Thus the gate-source voltage of transistor 630 (i.e., V631-V632) increases by a significant amount, and the current through transistor 630 is decreased accordingly. Consequently, the current through transistor 630 is less than as described above for the no-perturbation state and, in turn the current through transistor 645 is decreased, and further, the current through transistor 640 is decreased. The threshold of spike amplitude to which the spike detector 600 reacts in this way may established (or "predetermined") by parameters of various circuit components. For example, the amount by which spike is attenuated by the filter formed by resistor 606 and capacitor 607 may be determined by the value of the resistor 606 and/or the value of the capacitor 607. Those values are established by the circuit's designer, for example to meet a specification, or to meet the needs of the system in which the spike detector will be used. In short, the greater the attenuation, the smaller the spike needed to trigger the spike detector to produce a capdetect flag at output 132.

As described above, transistor 640 is larger than transistor 645 such that the current mirrored by transistor 640 is larger than the current through transistor 645. Under these conditions the current through transistor 640 to transistor 620 is smaller than the amount of current that transistor 620 is configured to sink, with the result that the drain-source voltage across transistor 620 drops, producing an impulse (schematically illustrated as negative-going voltage spike V603 in FIG. 6E) at node 603. The voltage at node 603 drops to a point low enough that inverters 658 and 659, which are coupled in series to node 603, produce a logic zero, which may be known as the "capdetect flag" (schematically illustrated as negative-going voltage signal V132 in FIG. 6F) at output 132.

As an example, in some embodiments, the reference current produced by transistor 610 may be 10 micro-Amps, so that the mirrored current at the drain 623 of transistor 620 is also 10 micro-Amps, and the mirrored current at the drain 633 of transistor 630 is also 10 micro-Amps, when there is no perturbation on output 102. When there is a perturbation on output 102, the reference current produced by transistor 610 may be 10 micro-Amps, so that the mirrored current at the drain 623 of transistor 620 may remain close to 10 micro-Amps, and the mirrored current at the drain 623 of transistor 620 also remains about 10 micro-Amps. However, the mirrored current at the drain 633 of transistor 630 may decrease to about 5 micro-Amps.

Consequently, the input current to the current mirror formed by transistors 640 and 644, at the drain 648 of transistor 645, is about 5 micro-Amps, and the current mirrored by transistor 640 is slightly lower than 5 micro-Amps.

FIG. 6G: Positive-Going Spike Detector

An alternate embodiment 650 of a spike detector is schematically illustrated in FIG. 6G, and is configured to detect a negative-going spike. An input node 651 to the circuit 650 is electrically coupled to the voltage output 102 of the regulator 101, and also coupled to the sources (662, 672, and 682, respectively) of three N-channel transistors 660 (which may be referred to as "mnbias," and which has gate 661, source 662, and drain 663), 670 (which may be referred to as "mnout," and which has gate 671, source 672, and drain 673), and 680 (which may be referred to as "mnclamp," and which has gate 681, source 682, and drain 683).

In this configuration, and when no perturbation is applied to the voltage output 102 of the regulator 101, transistor 660 draws current from Vsupply 240 through resistor 665 (which may be referred to as "rbias"). That current may be referred to as the "reference current" (or "bias current") and causes a voltage at the node 652.

The gates 671 and 681 of transistor 670 and 680, respectively, are each electrically coupled to node 652, and each transistor 670 and 680 is thereby configured to mirror the reference current through transistor 660. In this embodiment, the transistors 670 and 680 each sink, at their drains 673 and 683 respectively, a current identical to the reference current.

The drain 673 of transistor 670 is electrically coupled to the drain 693 of P-channel transistor 690, forming node 653, and the drain 683 of transistor 680 is electrically coupled to the drain 698 of P-channel transistor 695.

The gates 691 and 696 of transistors 690 and 695, respectively, are coupled to each other, and to the drain 698 of transistor 695, so that transistor 690 mirrors the current through transistor 695. However, transistor 690 is slightly smaller than transistor 695, such that the ratio of the size of transistor 695 to transistor 690 is N/(N−m), and transistor 690 is configured to sink less current than flows through transistor 695. In this example, the ratio of the current through transistor 695 to the current mirrored in, and sunk by, transistor 690 is equal to the ratio of their sizes: N/(N−m).

As described above, the current provided from transistor 690 to transistor 670 is less than the current provided to transistor 680 from transistor 695, so the current available for transistor 670 to sink is less than transistor 670 is configured to sink. Consequently, in these conditions, the drain-source voltage across transistor 670 is very low, with the result that the voltage of node 653 is very close to Vdd 102. As such, inverters 658 and 659, which are coupled in series to node 653, produce a logic zero at output 132.

Figures 6H, 6I, 6J, 6K, 6L:
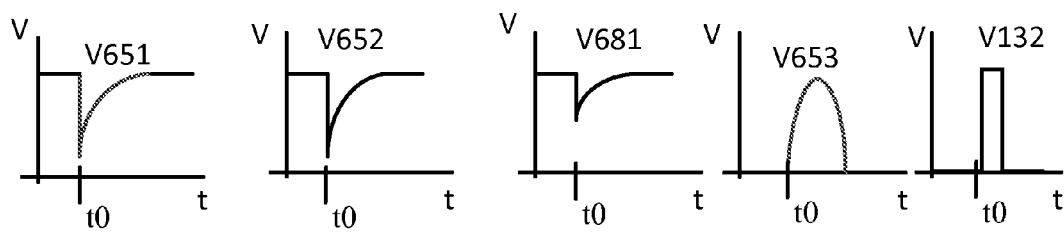

When the voltage output 102 reacts to a perturbation with a negative-going spike, such as spike V651 at time t0 (FIG. 6H; which represents a negative-going voltage spike at node 651) for example, the current flows through the circuit 650 change. The gate 661 of transistor 660 and the gate 671 of transistor 670 are coupled to the output 102 of the linear regulator through capacitor 655. Consequently, the voltage spike at node 652 (schematically illustrated as negative-going voltage spike V652 in FIG. 6I) causes a slight, but negligible drop in the current through transistor 660, and transistor 670 continues to mirror that current as described above. In the case of transistors 660 and 670, both the gate (661 and 671, respectively) and source (662 and 672, respectively) undergoes substantially identical voltage spikes (FIG. 6I and FIG. 6H, respectively). Thus the gate-source voltage for each of transistors 660 and 670 is almost the same as before the spike. It is the gate-source voltage that determines the current in the transistor and since this does not change much, neither does the current through those transistors 660 and 670.

However, resistor 666 and capacitor 657 form a filter that attenuates the voltage spike between node 652 and the gate 681 of transistor 680, with the result that the voltage spike at the gate 681 of transistor 680 (schematically illustrated as negative-going voltage spike V681 in FIG. 6J) is smaller than (i.e., has a smaller amplitude than) the voltage spike at node 651. In the case of transistor 680, the voltage spike in the source 682 is the same as that applied to the sources 662 and 672 of transistors 660 and 670 (FIG. 6H), but the spike in the gate 681 is smaller (because of the RC filter formed by resistor 606 and capacitor 607). Thus the gate-source voltage of transistor 680 (i.e., V681-V682) increases by a significant amount, and the current through transistor is increased accordingly. Consequently, the current through transistor 680 is more than as described above for the no-perturbation state and, in turn the current drawn through transistor 695 is increased, and further, the current through transistor 690 is increased The threshold of spike amplitude to which the spike detector 650 reacts in this way may be established (or "predetermined") by parameters of various circuit components. For example, the amount by which spike is attenuated by the filter formed by resistor 666 and capacitor 657 may be determined by the value of the resistor 666 and/or the value of the capacitor 657. Those values are established by the circuit's designer, for example to meet a specification, or to meet the needs of the system in which the spike detector will be used. In short, the greater the attenuation, the smaller the spike needed to trigger the spike detector to produce a capdetect flag at output 132.

As described above, transistor 690 is smaller than transistor 695 such that the current mirrored by transistor 690 is smaller than the current through transistor 695. Nevertheless, the current through transistor 690 is still greater than the current that transistor 670 is configured to sink, with the result that the drain-source voltage across transistor 670 rises, producing an impulse (schematically illustrated as positive-going voltage spike V653 in FIG. 6K) at node 653. The voltage at node 653 rises to a point high enough that inverters 658 and 659, which are coupled in series to node 653, produce a logic one, which may be known as the "capdetect flag" (schematically illustrated as positive-going voltage signal V132 in FIG. 6L) at output 132.

As an example, in some embodiments, the reference current produced by transistor 660 may be 10 micro-Amps, so that the mirrored current at the drain 673 of transistor 670 is also 10 micro-Amps, and the mirrored current at the drain 683 of transistor 680 is also 10 micro-Amps, when there is no perturbation on output 102. When there is a perturbation on output 102, the reference current produced by transistor 660 may be 10 micro-Amps, so that the mirrored current at the drain 673 of transistor 670 may remain close to 10 micro-Amps, and the mirrored current at the drain 673 of transistor 670 also remains about 10 micro-Amps. However, the mirrored current at the drain 683 of transistor 680 may rise to about 15 micro-Amps.

Consequently, the input current to the current mirror formed by transistors 690 and 695, at the drain 698 of transistor 695, is about 15 micro-Amps, and the current mirrored by transistor 690 is slightly lower than 15 micro-Amps, which is still greater than the current that transistor 670 is configured to sink.

Figure 7:
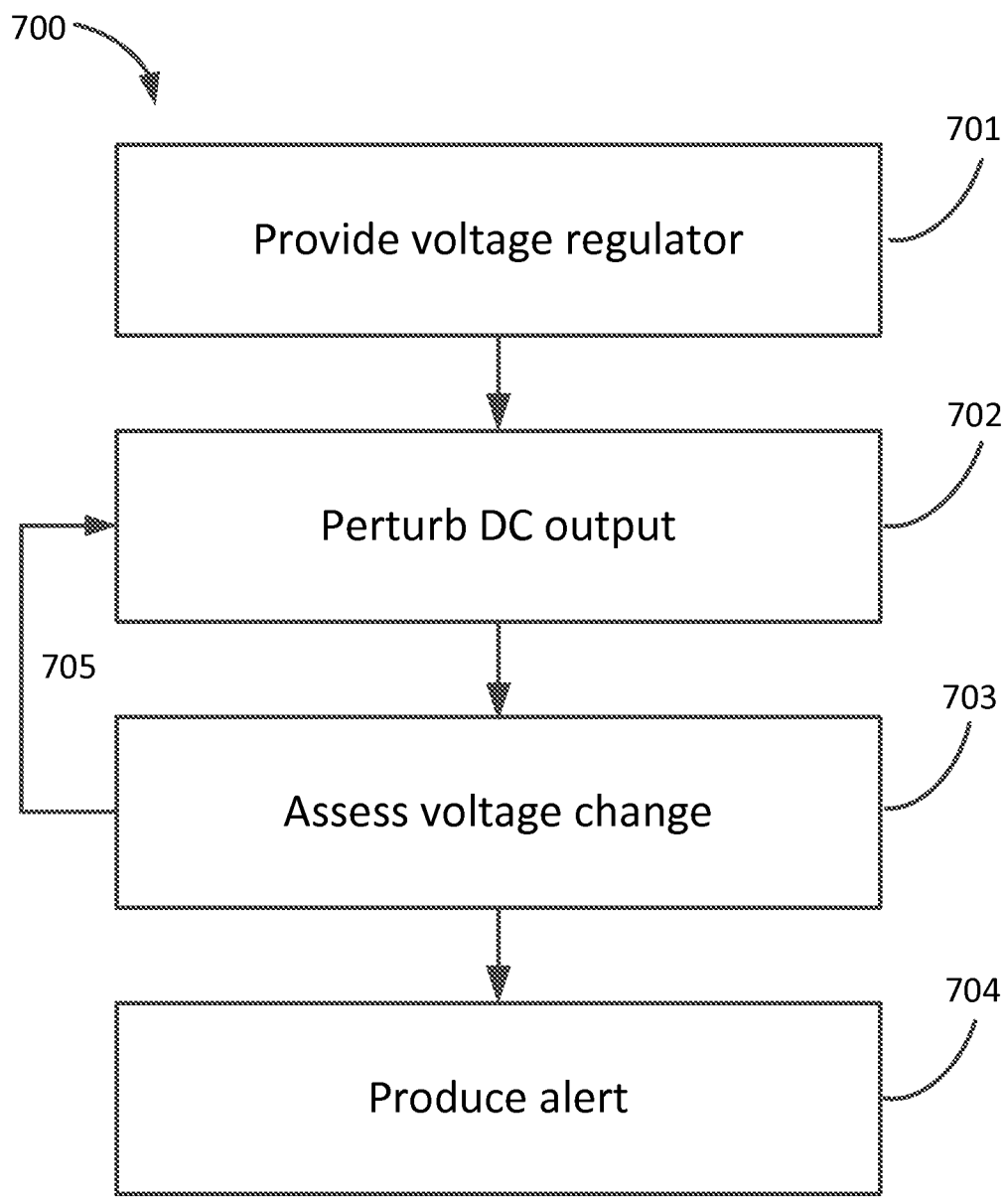
FIG. 7 schematically illustrates a method of method of detecting the absence of a desired capacitance.

FIG. 7 schematically illustrates a method 700 of detecting the absence of a desired capacitance on the output of a voltage regulator. The method includes providing a voltage regulator having a desired capacitance coupled to its output node at step 701. The voltage regulator may be a linear voltage regulator, for example. Step 701 may include coupling the voltage regulator output node to a load circuit, such as a signal processing circuit for example, and establishing the regulator in steady-state operation such that the regulator supplies a regulated DC voltage to the voltage output node.

Step 702 includes perturbing the DC output of the voltage regulator to create change in the output voltage (e.g., a voltage transient for example). For example, perturbing the DC output may include injecting a discrete charge packet onto the DC output, or extracting a charge packet from the DC output. Injecting or extracting charge causes a small voltage change or transient on the DC output if the desired capacitance is coupled to the output node, and a larger voltage change or transient on the DC output if the desired capacitance is not coupled to the output node. In various embodiments, perturbing the DC output of the voltage regulator may include perturbing with a periodic signal, or an aperiodic signal.

In some embodiments, injecting a discrete charge packet at the output node includes providing a discrete electrical pulse at a control input of a transistor coupled between a voltage source and the output node, such that the transistor produces the discrete charge packet onto the output node. In some embodiments, extracting a discrete charge packet at the voltage output node includes providing a discrete electrical pulse at a control input of a transistor coupled between a ground reference and the output node, the transistor sinking the discrete charge packet from the voltage output node.

In some embodiments, the voltage regulator has a bandwidth, and the step of perturbing the regulated DC voltage includes perturbing the regulated DC voltage periodically, the perturbations being have a pulse width outside of the voltage regulator's bandwidth, or aperiodically but still outside the voltage regulator's bandwidth.

In some embodiments, the voltage regulator provides power to a load circuit configured to process a signal. The load circuit may have a signal bandwidth, and/or the signal may have a signal bandwidth. In such embodiments, the step of perturbing the regulated DC voltage includes perturbing the regulated DC voltage periodically at a period that is outside of the one or both of the signal bandwidths.

The method then assesses the voltage change (e.g., transient) at step 703, and producing an alert at step 704 if the voltage change at the output node exceeds a pre-determined threshold. Assessing the voltage change may include, for example, comparing the voltage change to a predetermined threshold voltage. In some embodiments, assessing the magnitude of a voltage change at the voltage output node includes processing the regulated DC voltage through a transconductance spike detector circuit such as the circuits described above.

In some embodiments in which the voltage regulator has a bandwidth, perturbing the regulated DC voltage includes perturbing the regulated DC voltage with a periodic current signal having a frequency outside of the bandwidth, and band-pass filtering the voltage at the regulator output node with a band-pass filter configured to pass the frequency of the periodic current signal and to block the regulated DC voltage, and to thereby produce a filtered signal, and assessing the amplitude of the filtered signal.

If the assessment of the voltage change at step 703 indicates the absence of the desired capacitance, the method produces an alert (e.g., cap detect flag) at step 704. Otherwise, the method may loop back to step 702, as indicated by step 705.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A system for monitoring a total capacitance loading an output node, the system comprising:
    a voltage regulator configured to produce a D.C. output voltage at the output node;
    a controllable charge packet source operably coupled to the output node, the charge packet source configured to perturb the voltage output of the voltage regulator with a discrete charge packet, thereby causing a voltage transient at the output node, the voltage transient having a magnitude as a function of the total capacitance loading the output node; and
    a perturbation detector circuit operably coupled to the output node, the perturbation detector configured to assess the magnitude of the voltage transient at the output node, and to produce an alert signal if the magnitude of the voltage transient at the output node exceeds a predetermined threshold.

2. The system of claim 1, wherein the controllable charge packet source includes:

a control input configured to cause the controllable charge packet source to produce a discrete charge packet in response to a control signal; and
a pulse generator configured to produce the control signal to the control input of the controllable charge packet source.

3. The system of claim 2, wherein the control signal comprises a series of control pulses, such that the controllable charge packet source produces a corresponding series of discrete charge packets.

4. The system of claim 3, wherein the series of discrete charge packets is periodic.

5. The system of claim 3, wherein the regulator is a linear voltage regulator having a feedback path and bandwidth, and the pulse generator produces a series of control pulses, each of the control pulses having a pulse width outside the bandwidth of the linear voltage regulator such that the feedback path does not respond to any single one of the discrete charge packets, the series of control pulses having a frequency outside the signal bandwidth of a load circuit.

6. The system of claim 1, further comprising an output configured to provide the alert signal to another circuit.

7. The system of claim 1, further comprising an output configured to provide the alert signal to a load coupled to the output node.

8. The system of claim 1, wherein the perturbation detector circuit comprises a transconductance spike detector circuit.

9. A method of monitoring a total capacitance loading an output node, the method comprising:
    providing a linear voltage regulator circuit having a regulated DC voltage at the output node;
    perturbing the regulated DC voltage by injecting or extracting a discrete charge packet into or from the output node, thereby causing a voltage transient at the output node, the voltage transient having a magnitude as a function of the total capacitance loading the output node; and
    assessing the magnitude of the voltage transient at the output node.

10. The method of claim 9, wherein assessing the magnitude of the voltage transient at the output node comprises comparing the voltage transient to a predetermined threshold voltage.

11. The method of claim 9, further comprising producing an alert if the magnitude of the voltage transient at the output node exceeds a predetermined threshold.

12. The method of claim 9, wherein:
    injecting a discrete charge packet into the output node comprises providing a discrete electrical pulse at a control input of a transistor coupled between a voltage source and the output node, the transistor producing the discrete charge packet into the output node; and wherein:
    extracting a discrete charge packet from the output node comprises providing a discrete electrical pulse at a control input of a transistor coupled between a ground reference and the output node, the transistor sinking the discrete charge packet from the output node.

13. The method of claim 9, wherein the linear voltage regulator circuit has a bandwidth, and wherein perturbing the regulated DC voltage comprises perturbing the regulated DC voltage periodically at a period that is outside of the linear voltage regulator's bandwidth.

14. The method of claim 9, wherein the linear voltage regulator circuit has a bandwidth, and wherein perturbing the regulated DC voltage comprises perturbing the regulated DC voltage aperiodically outside the linear voltage regulator's bandwidth.

15. The method of claim 9, wherein:
the linear voltage regulator circuit has a bandwidth; and
wherein perturbing the regulated DC voltage comprises perturbing the regulated DC voltage with a periodic current signal having a frequency outside of the bandwidth, and band-pass filtering the regulator output node with a band-pass filter configured to pass the frequency of the periodic current signal and to block the regulated DC voltage, and to thereby produce a filtered signal; and
wherein assessing the magnitude of the voltage transient at the output node comprises assessing the amplitude of the filtered signal.

16. The method of claim 9, further comprising:
coupling the output node to a load circuit; and
prior to perturbing the regulated DC voltage, establishing the linear voltage regulator circuit in a steady state of operation such that the linear voltage regulator circuit supplies a regulated DC voltage to the output node.

17. A system for monitoring a total capacitance loading an output node, the system comprising:
a linear voltage regulator configured to produce a D.C. output voltage at the output node;
means for perturbing the voltage output of the linear voltage regulator with a discrete charge packet, thereby causing a voltage transient at the output node, the voltage transient having a magnitude as a function of the total capacitance loading the output node;
a perturbation detector means operably coupled to the output node, the perturbation detector configured to assess the magnitude of the voltage transient at the output node, and to produce an alert signal if the magnitude of the voltage transient at the output node exceeds a predetermined threshold.

18. The system of claim 17, wherein the means for perturbing the voltage output of the linear voltage regulator includes:
a control input configured to cause the controllable charge packet source to produce a discrete charge packet in response to a control signal; and
a pulse generator configured to produce the control signal to the control input of the controllable charge packet source.

19. The system of claim 18, wherein the control signal comprises a periodic series of control pulses.

20. The system of claim 17, wherein the perturbation detector means comprises a transconductance spike detector circuit.

* * * * *